United States Patent
Mojab

(10) Patent No.: US 11,496,129 B2
(45) Date of Patent: Nov. 8, 2022

(54) METHOD AND SYSTEM OF CURRENT SHARING AMONG BIDIRECTIONAL DOUBLE-BASE BIPOLAR JUNCTION TRANSISTORS

(71) Applicant: IDEAL POWER INC., Austin, TX (US)

(72) Inventor: Alireza Mojab, Austin, TX (US)

(73) Assignee: IDEAL POWER INC., Austin, TX (US)

( * ) Notice: Subject to any disclaimer, the term of this patent is extended or adjusted under 35 U.S.C. 154(b) by 12 days.

(21) Appl. No.: 17/340,604

(22) Filed: Jun. 7, 2021

(65) Prior Publication Data

US 2021/0384900 A1    Dec. 9, 2021

Related U.S. Application Data

(60) Provisional application No. 63/036,921, filed on Jun. 9, 2020, provisional application No. 62/705,038, filed on Jun. 8, 2020.

(51) Int. Cl.
*H03K 17/66* (2006.01)
*H02M 11/00* (2006.01)
*H01L 27/082* (2006.01)

(52) U.S. Cl.
CPC ......... *H03K 17/666* (2013.01); *H01L 27/082* (2013.01); *H02M 11/00* (2013.01)

(58) Field of Classification Search
CPC ..... H03K 17/666; H01L 27/082; H02M 11/00
USPC ........................................................ 327/405
See application file for complete search history.

(56) References Cited

U.S. PATENT DOCUMENTS

| | | | |
|---|---|---|---|
| 9,029,909 B2 | 5/2015 | Blanchard et al. |
| 9,035,350 B2 | 5/2015 | Blanchard et al. |
| 9,054,706 B2 | 6/2015 | Blanchard et al. |
| 9,054,707 B2 | 6/2015 | Blanchard et al. |
| 9,059,710 B2 | 6/2015 | Blanchard et al. |
| 9,190,894 B2 | 11/2015 | Blanchard et al. |
| 9,203,400 B2 | 12/2015 | Blanchard et al. |

(Continued)

FOREIGN PATENT DOCUMENTS

| | | |
|---|---|---|
| CN | 105308750 A | 2/2016 |
| EP | 2954557 B1 | 12/2015 |

(Continued)

OTHER PUBLICATIONS

"B-Tran—Bi-Directional Bi-Polar Junction TRANsistor"; White Paper (2), Apr. 2016, idealpower.com, p. 1-11.

*Primary Examiner* — Tomi Skibinski
(74) *Attorney, Agent, or Firm* — Dickinson Wright PLLC; Mark E. Scott

(57) ABSTRACT

Current sharing among bidirectional double-base bipolar junction transistors. One example is a method comprising: conducting current through a first bidirectional double-base bipolar junction transistor (first B-TRAN); conducting current through a second B-TRAN the second B-TRAN coupled in parallel with the first B-TRAN; measuring a value indicative of conduction of the first B-TRAN, and measuring a value indicative of conduction of the second B-TRAN; and adjusting a current flow through the first B-TRAN, the adjusting responsive to the value indicative of conduction of the first B-TRAN being different than the value indicative of conduction of the second B-TRAN.

22 Claims, 10 Drawing Sheets

(56) References Cited

U.S. PATENT DOCUMENTS

| | | |
|---|---|---|
| 9,203,401 B2 | 12/2015 | Blanchard et al. |
| 9,209,713 B2 | 12/2015 | Blanchard et al. |
| 9,209,798 B2 | 12/2015 | Blanchard et al. |
| 9,231,582 B1 | 1/2016 | Blanchard et al. |
| 9,337,262 B2 | 5/2016 | Blanchard et al. |
| 9,355,853 B2 | 5/2016 | Blanchard et al. |
| 9,356,595 B2 | 5/2016 | Blanchard et al. |
| 9,369,125 B2 | 6/2016 | Blanchard et al. |
| 9,374,084 B2 | 6/2016 | Blanchard et al. |
| 9,374,085 B2 | 6/2016 | Blanchard et al. |
| 9,444,449 B2 | 9/2016 | Bundschuh et al. |
| 9,614,028 B2 | 4/2017 | Blanchard et al. |
| 9,647,553 B2 | 5/2017 | Blanchard et al. |
| 9,660,551 B2 | 5/2017 | Blanchard et al. |
| 9,679,999 B2 | 6/2017 | Blanchard et al. |
| 9,742,385 B2 | 8/2017 | Blanchard et al. |
| 9,742,395 B2 | 8/2017 | Blanchard et al. |
| 9,786,773 B2 | 10/2017 | Blanchard et al. |
| 9,787,298 B2 | 10/2017 | Blanchard et al. |
| 9,787,304 B2 | 10/2017 | Blanchard et al. |
| 9,799,731 B2 | 10/2017 | Blanchard et al. |
| 9,818,615 B2 | 11/2017 | Blanchard et al. |
| 9,899,868 B2 | 2/2018 | Blanchard et al. |
| 9,900,002 B2 * | 2/2018 | Alexander .......... H01L 29/1004 |
| 10,056,372 B2 | 8/2018 | Blanchard et al. |
| 10,211,283 B2 | 2/2019 | Blanchard et al. |
| 10,418,471 B2 | 9/2019 | Blanchard et al. |
| 10,497,699 B2 | 12/2019 | Blanchard et al. |
| 10,580,885 B1 | 3/2020 | Blanchard et al. |
| 10,892,354 B2 | 1/2021 | Blanchard et al. |
| 2016/0005732 A1 | 1/2016 | Wood |
| 2016/0344300 A1 | 11/2016 | Alexander |
| 2017/0287721 A1 | 10/2017 | Wood |
| 2018/0130898 A1 | 5/2018 | Blanchard et al. |
| 2019/0043969 A1 | 2/2019 | Wood |
| 2019/0363196 A1 | 11/2019 | Wood |
| 2020/0111672 A1 | 4/2020 | Blanchard et al. |
| 2020/0321455 A1 | 10/2020 | Wood |

FOREIGN PATENT DOCUMENTS

| | | |
|---|---|---|
| GB | 2510716 A | 8/2014 |
| GB | 2524699 A | 9/2015 |
| GB | 2546475 A | 7/2017 |
| GB | 2572702 A | 10/2019 |
| TW | 201834373 A | 9/2018 |
| WO | 2014122472 A1 | 8/2014 |
| WO | 2018109452 A1 | 6/2018 |

* cited by examiner

METHOD AND SYSTEM OF CURRENT SHARING AMONG BIDIRECTIONAL DOUBLE-BASE BIPOLAR JUNCTION TRANSISTORS

CROSS-REFERENCE TO RELATED APPLICATIONS

This application claims the benefit of U.S. Provisional App. No. 62/705,038 filed Jun. 8, 2020 titled "Current Sharing in B-TRAN and Drive B-TRAN as a PTC Device" and U.S. Provisional App. No. 63/036,921 filed Jun. 9, 2020 titled "Unified Control To Account For Device Variation In Switching Speed." Both applications are incorporated by reference herein as if reproduced in full below.

BACKGROUND

A bidirectional double-base bipolar junction transistor (hereafter B-TRAN) is junction transistor constructed with a base and collector-emitter on a first side of the bulk region, and a distinct and separate base and collector-emitter on a second side of the bulk region opposite the first side. When properly configured by an external driver, electrical current may selectively flow through a B-TRAN in either direction, and thus B-TRAN devices are considered bidirectional devices. Based on the bidirectionality, whether a collector-emitter is considered a collector (e.g., current flow into the B-TRAN) or an emitter (e.g., current flow out of the B-TRAN) depends on the applied external voltage and thus the direction of current flow through the B-TRAN. When a particular collector-emitter is acting as a collector, the base on the same side of the bulk region may be referred as a collector-side base or c-base. Relatedly when a particular collector-emitter is acting as an emitter, the base on the same side of the bulk region may be referred as an emitter-side base or e-base.

In implementations in which the desired current flow is greater than can be carried by a single B-TRAN, a plurality of B-TRANs may be coupled in parallel to share the total current. However, a B-TRAN may be considered negative temperature coefficient device, meaning that for a constant applied voltage across the B-TRAN, current flow through the B-TRAN is directly proportional to temperature of the B-TRAN. When a plurality of B-TRANs are coupled in parallel, slight differences in temperature can result one B-TRAN carrying more current than its parallel brethren. More current causes higher temperature, and thus the negative feedback of negative temperature coefficient can result in early failure of the higher current-carrying device.

BRIEF DESCRIPTION OF THE DRAWINGS

For a detailed description of example embodiments, reference will now be made to the accompanying drawings in which.

DEFINITIONS

Figure 1:
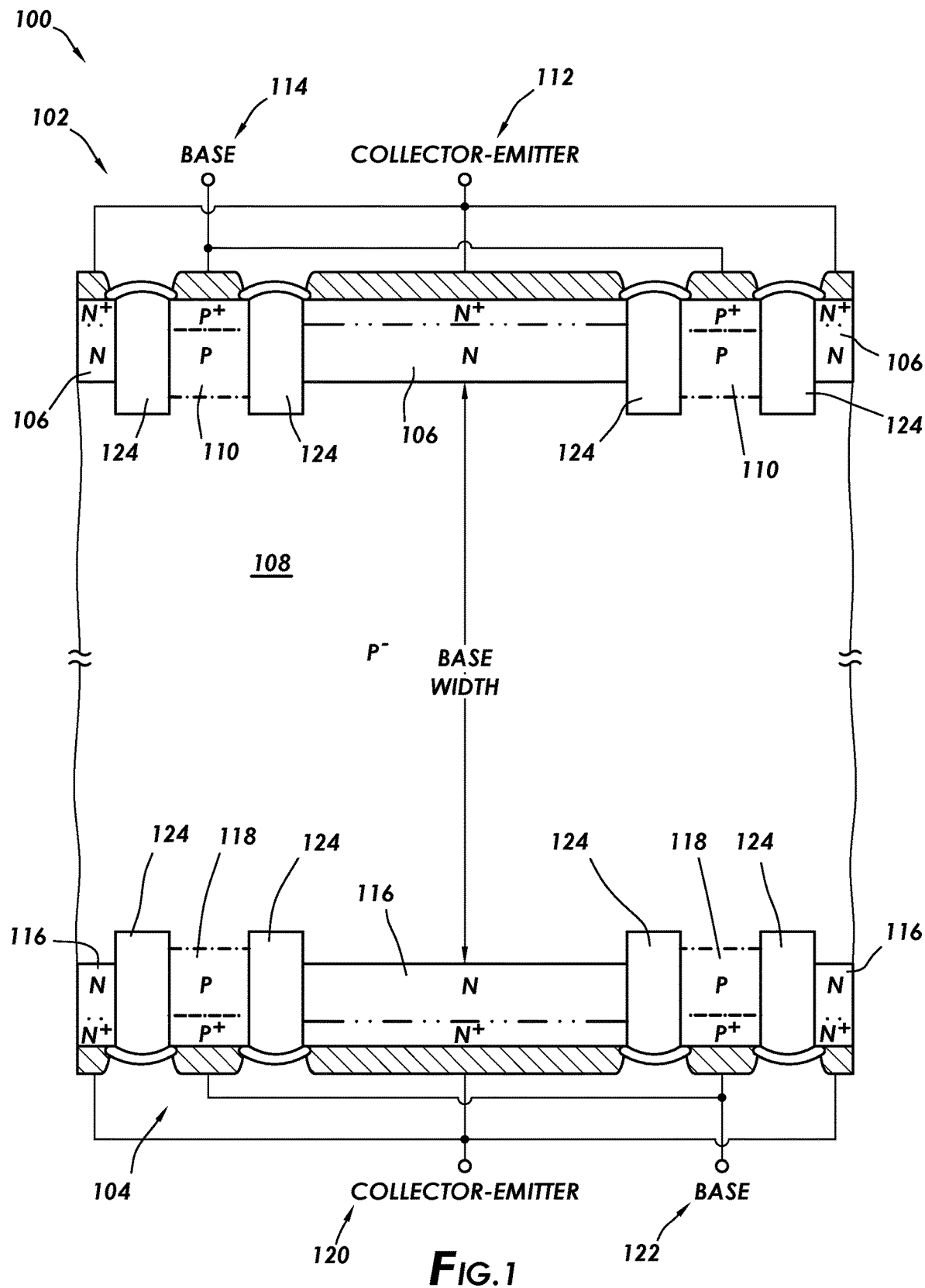
FIG. 1 shows a cross-sectional elevation view of a B-TRAN in accordance with at least some embodiments.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct connection. Thus, if a first device couples to a second device, that connection may be through a direct connection or through an indirect connection via other devices and connections.

"About" in reference to a recited parameter shall mean the recited parameter plus or minus ten percent (+/−10%) of the recited parameter.

"Assert" shall mean changing the state of a Boolean signal. Boolean signals may be asserted high or with a higher voltage, and Boolean signals may be asserted low or with a lower voltage, at the discretion of the circuit designer. Similarly, "de-assert" shall mean changing the state of the Boolean signal to a voltage level opposite the asserted state.

"Bidirectional double-base bipolar junction transistor" shall mean a junction transistor having a base and a collector-emitter on a first face or first side of a bulk region, and having a base and a collector-emitter on a second face or second side of the bulk region. The base and the collector-emitter on the first side are distinct from the base and the collector-emitter on the second side. An outward pointing vector normal to the first side points an opposite direction to an outward pointing vector normal to the second side.

"Upper base" shall mean a base of a bidirectional double-base bipolar junction transistor on a first side of a bulk region of the transistor, and shall not be read to imply a location of the base with respect to gravity.

"Lower base" shall mean a base of a bidirectional double-base bipolar junction transistor on a second side of a bulk region of the transistor opposite a first side, and shall not be read to imply a location of the base with respect to gravity.

"Upper collector-emitter" shall mean a collector-emitter of a bidirectional double-base bipolar junction transistor on a first side of a bulk region of the transistor, and shall not be read to imply a location of the base with respect to gravity.

"Lower collector-emitter" shall mean a collector-emitter of a bidirectional double-base bipolar junction transistor on a second side of a bulk region of the transistor opposite a first side, and shall not be read to imply a location of the base with respect to gravity.

"Injecting charge carries into a base" (e.g., upper base, lower base) of a transistor shall not include directly coupling (e.g., through a transistor) the base to a collector-emitter on the same side of the transistor.

The terms "input" and "output" when used as nouns refer to connections (e.g., electrical, software), and shall not be read as verbs requiring action. For example, a controller may define switch output coupled to a control input of an electrically-controlled switch. In systems implemented directly in hardware (e.g., on a semiconductor substrate), these "inputs" and "outputs" define electrical connections. In systems implemented in software, these "inputs" and "outputs" define parameters read by or written by, respectively, the instructions implementing the function.

"Controller" shall mean, alone or in combination, individual circuit components, an application specific integrated circuit (ASIC), a microcontroller with controlling software, a reduced-instruction-set computing (RISC), a digital signal processor (DSP), process with controlling software, a processor with controlling software, a programmable logic device (PLD), or a field programmable gate array (FPGA), configured to read inputs and drive outputs responsive to the inputs.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Various examples are directed to methods and systems of current sharing among bidirectional double-base bipolar junction transistors (B-TRANs). In particular, various examples are directed to a switch assembly having two or more B-TRANs coupled in parallel, and measuring a value indicative of conduction (e.g., temperature, current flow) through each B-TRAN. Based on the value indicative conduction, if there is a current imbalance as between the B-TRANs, a controller of the switch assembly adjusts magnitude of the current of one or both of the B-TRANs to reduce the chances of damage caused by the negative temperature coefficient behavior of each B-TRAN device individually. The specification first turns to an example B-TRAN device to orient the reader.

FIG. 1 shows a cross-sectional elevation view of a B-TRAN in accordance with at least some embodiments. In particular, FIG. 1 shows a B-TRAN 100 having an upper face or upper side 102 and a lower face or lower side 104. The designations "upper" and "lower" are arbitrary and used merely for convenience of the discussion. The upper side 102 faces a direction opposite the lower side 104. Stated differently, an outward pointing vector normal to the average elevation of the upper side 102 (the vector not specifically shown) points an opposite direction with respect to an outward pointing vector normal to the average elevation of the lower side 104 (the vector not specifically shown).

The upper side 102 includes collector-emitter contact regions 106 which form a junction with the drift region or bulk substrate 108. The upper side 102 further defines base contact regions 110 disposed between the collector-emitter contact regions 106. The collector-emitter contact regions 106 are coupled together to form an upper collector-emitter 112. The base contact regions 110 are coupled together to form an upper base 114. Similarly, the lower side 104 includes collector-emitter contact regions 116 which form a junction with the bulk substrate 108. The lower side 104 further defines base contact regions 118 disposed between the lower collector-emitter contact regions 116. The collector-emitter contact regions 116 are coupled together to form a lower collector-emitter 120. The lower base contact regions 118 are coupled together to form a lower base 122.

The example B-TRAN 100 is an NPN structure, so the collector-emitter contact regions 106 and 116 are N-type, the base contact regions 110 and 118 are P-type, and the bulk substrate 108 is P-type. In the example system, a shallow N+ region provides ohmic contact from collector-emitter contact regions 106 and 116 to the respective collector-emitters 112 and 120. Further in the example system, shallow P+ contact doping provides ohmic contact from base contact regions 110 and 118 to the respective bases 114 and 122. In this example, dielectric-filled trenches 124 provide lateral separation between base contact regions and collector-emitter contact regions. Note that PNP-type B-TRAN devices are also contemplated; however, so as not to unduly lengthen the discussion a PNP-type B-TRAN device is not specifically shown.

In example cases, the various structures and doping associated with the upper side 102 are meant to be mirror images of the various structures and doping associated with the lower side 104. However, in some cases the various structures and doping associated with the upper side 102 are constructed at different times than the various structures and doping on the lower side 104, and thus there may be slight differences in the structures and doping as between the two sides. It follows the differences may be attributable to variances within manufacturing tolerances, but such does not adversely affect the operation of the device as a bidirectional double-base bipolar junction transistor. In order to describe operation of the example B-TRAN device, the specification now turns to an example model of the B-TRAN device, along with a simplified driver circuits.

Figure 2:
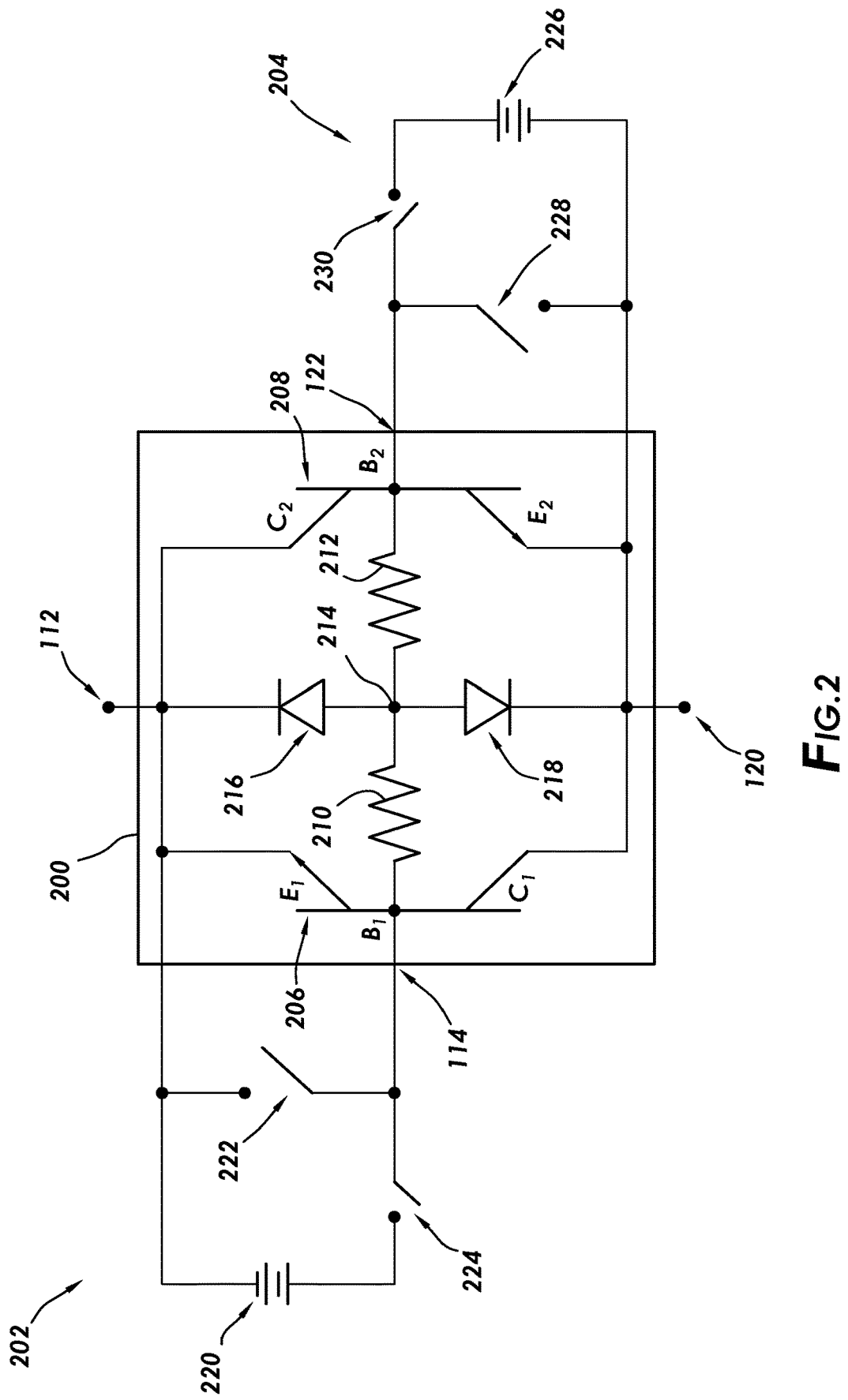
FIG. 2 shows an electrical schematic of an example model of a B-TRAN along with conceptual driver circuits, in accordance with at least some embodiments.

FIG. 2 shows an electrical schematic of an example model of a B-TRAN, along with an electrical schematic of a conceptual driver circuit. In particular, FIG. 2 shows a model 200 of a B-TRAN, along with a driver portion 202 for the upper side of the B-TRAN and a driver portion 204 for the lower side of the B-TRAN. Turning first to the model 200, the example model 200 defines the upper collector-emitter 112 and the upper base 114 (though in FIG. 2 the upper base 114 is shown on the left side). The driver portion 202 couples to the upper collector-emitter 112 and upper base 114. The example model 200 further defines the lower collector-emitter 120 and the lower base 122 (though in FIG. 2 the lower base 122 is shown on the right side). The driver portion 204 couples to the lower collector-emitter 120 and lower base 122.

Internally, the example model 200 comprises a first NPN transistor 206 having an emitter E1 coupled to the upper collector-emitter 112, a collector C1 coupled to the lower collector-emitter 120, and a base B1 defining the upper base 114. The example model 200 further includes a second NPN transistor 208 having an emitter E2 coupled to the lower collector-emitter 120, a collector C2 coupled to the upper collector-emitter 112, and a base B2 defining the lower base 122. The bases B1 and B2 are coupled together by series resistors 210 and 212 (representing the drift region of the bulk substrate), the series resistors 210 and 212 defining a node 214 between them. In the model 200, a diode 216 is coupled between the node 214 and the upper collector-emitter 112, and the diode 216 represents the upper PN junction between the upper base 114 and the upper collector-emitter 112. Similarly, a diode 218 is coupled between the node 214 and the lower collector-emitter 120, and the diode 218 represents the lower PN junction between the lower base 122 and the lower collector-emitter 120.

External to the model 200, an electrically-controlled switch 222 (hereafter just switch 222) has a first lead coupled to the upper collector-emitter 112 and a second lead coupled to the upper base 114. The example switch 222 is shown as a single-pole, single-throw switch in the open or non-conductive configuration, but in practice the switch 222 may be a field effect transistor (FET). Thus, when the switch 222 is conductive, the upper base 114 is coupled to the upper collector-emitter 112. The example driver portion 202 further comprises a source of charge carriers 220 illustratively shown as a battery. The source of charge carriers 220 has a negative lead coupled to the upper collector-emitter 112. Another electrically-controlled switch 224 (hereafter just switch 224) has a first lead coupled to the positive terminal of the source of charge carriers 220, and a second lead coupled to the upper base 114. The example switch 224 is shown as a single-pole, single-throw switch, but in practice the switch 224 may be a FET. Thus, when the switch 224 is conductive, the source of charge carriers 220 is coupled between the upper collector-emitter 112 and the upper base 114.

Still referring to FIG. 2, an electrically-controlled switch 228 (hereafter just switch 228) has a first lead coupled to the lower collector-emitter 120 and a second lead coupled to the lower base 122. The example switch 228 is shown as a single-pole, single-throw switch, but in practice the switch 228 may be a FET. Thus, when the switch 228 is conductive, the lower base 122 is coupled to the lower collector-emitter 120. The example driver portion 204 further comprises another source of charge carriers 226 illustratively shown as a battery. The source of charge carriers 226 has a negative lead coupled to the lower collector-emitter 120. An electrically-controlled switch 230 (hereafter just switch 230) has a first lead coupled to the positive terminal of the source of charge carriers 226, and a second lead coupled to the lower base 122. The example switch 230 is shown as a single-pole, single-throw switch, but in practice the switch 230 may be a FET. Thus, when the switch 230 is conductive, the source of charge carriers 226 is coupled between the lower collector-emitter 120 and the lower base 122.

Figure 3A:
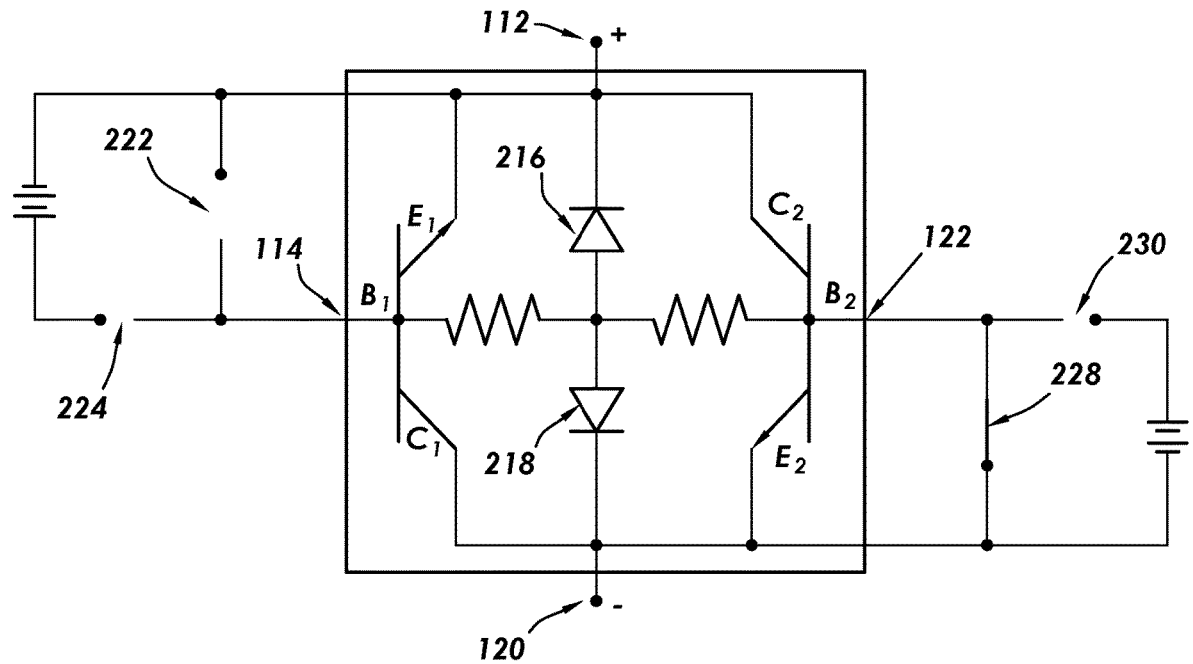
FIG. 3A shows the example model and driver circuits in which the B-TRAN is non-conductive, in accordance with example embodiments.

FIG. 3A shows the example model and driver portions in a mode in which the B-TRAN is non-conductive. The switches that are non-conductive are shown as open circuits, and the switches that are conductive are shown as electrical shorts. In particular, an external voltage is applied across the upper collector-emitter 112 and lower collector-emitter 120 with the more positive polarity on the upper collector-emitter 112. In the configuration shown in FIG. 3A, the switch 228 is conductive and all the remaining switches are non-conductive. Switch 228 being conductive directly couples the lower collector-emitter 120 and the lower base 122, which effectively bypasses or shorts the lower PN junction (illustrated by diode 218) and ensures the upper PN junction (illustrated by diode 216) is reverse biased. Moreover, the upper base 114 is electrically floated. Thus, no current flows through the B-TRAN and overall the B-TRAN is non-conductive for the applied polarity. The arrangement of FIG. 3A may therefore be referred to as the off mode.

Figure 3B:
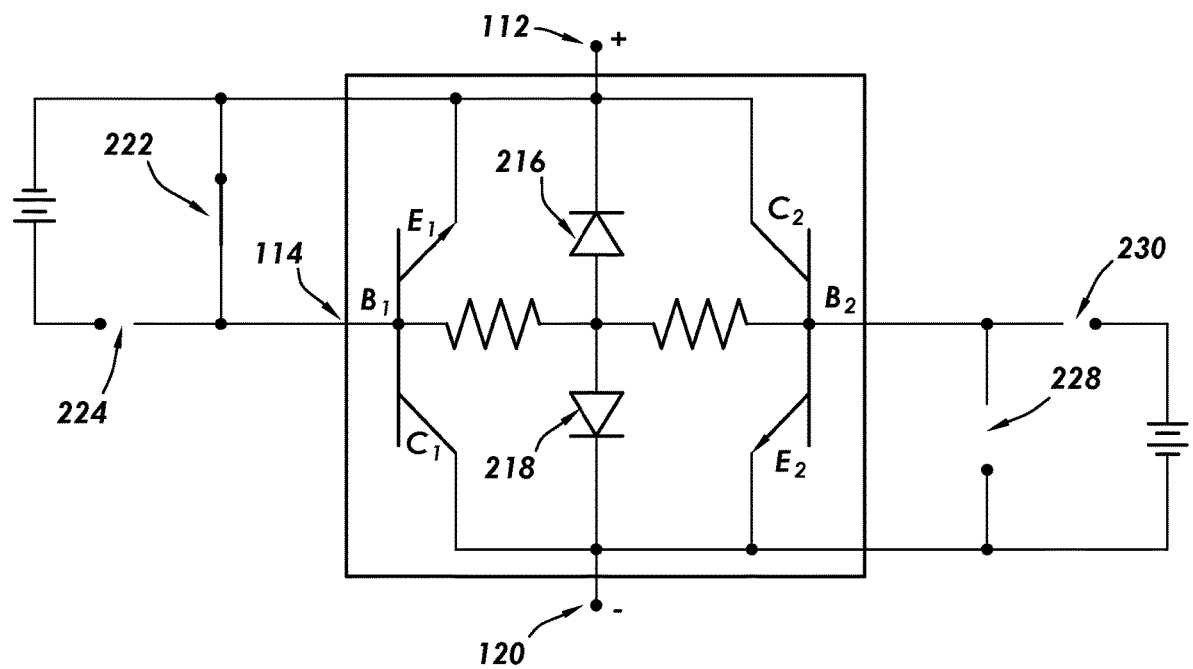
FIG. 3B shows the example model and driver circuits arranged for diode conduction, in accordance with at least some embodiments.

Now consider that the B-TRAN is to be made conductive. FIG. 3B shows the example model and driver portions arranged for an optional diode conduction mode. In particular, in order to initially make the B-TRAN conductive with the external voltage in the polarity as shown, switch 222 is made conductive and switch 228 is made non-conductive. Switches 224 and 230 remain non-conductive. In the configuration shown, the upper PN junction (illustrated by diode 216) is bypassed, and the lower PN junction illustrated by diode 218 is forward biased. Thus, current flows from the upper collector-emitter 112 and upper base 114 to the lower collector-emitter 120 in what is termed the diode-on mode. In the configuration shown, the forward voltage drop is relatively low. In one example, the forward voltage drop is about 1.0V at a current density of about 200 A/cm2. However, the forward voltage drop can be lower.

Figure 3C:
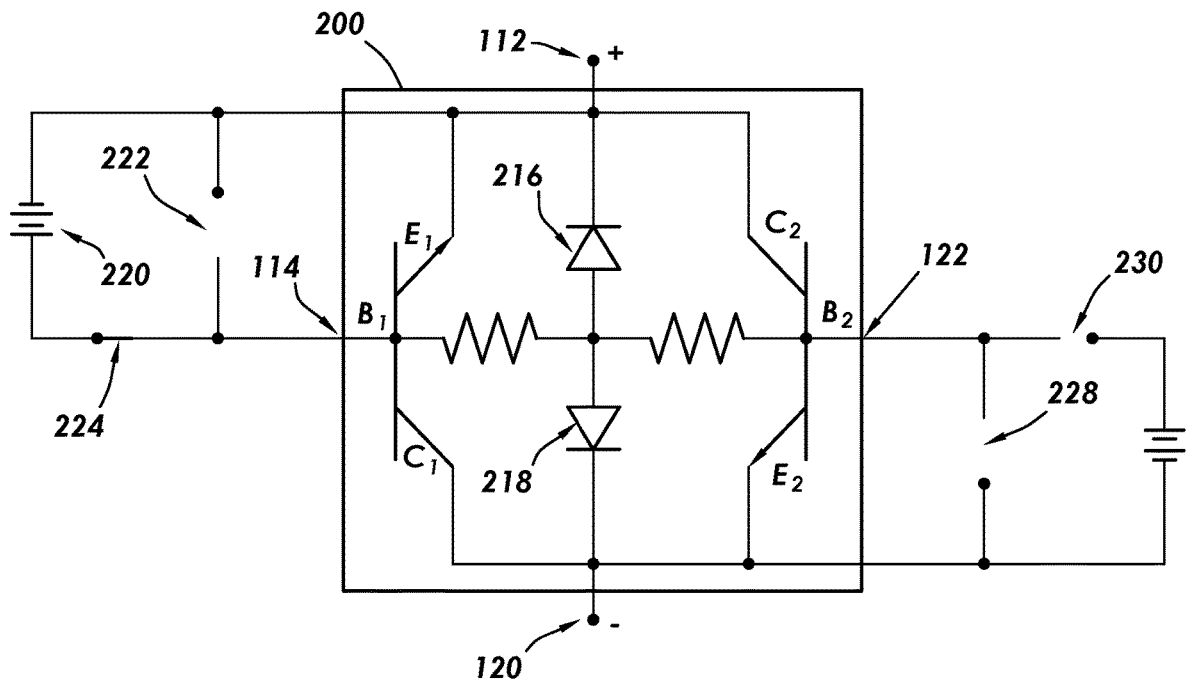
FIG. 3C shows the example model and driver circuit arranged for conduction, in accordance with at least some embodiments.

FIG. 3C shows the example model and driver portions arranged for conduction. In cases where the diode-on mode is used, in order to further lower the forward voltage drop across the B-TRAN, switch 222 is made non-conductive, switch 224 is made conductive, and switches 228 and 230 remain non-conductive. In cases where the diode-on mode is omitted, from the off mode shown in FIG. 3A, switch 228 is made non-conductive, switch 224 is made conductive, and switches 222 and 230 remain non-conductive. In the configuration shown, the source of charge carriers 220 is coupled between the upper collector-emitter 112 and the upper base 114. The result is that the voltage on the upper base 114 is driven higher than the voltage on the upper collector-emitter 112. Though the lower base 122 is not externally connected and is electrically floated, the lower base 122 is internally connected through the drift region of the B-TRAN, and thus the lower base 122 may be (depending on the example voltage of the source of charge carriers 220) driven higher than the voltage on the upper collector-emitter 112. Thus, both of the example transistors of the model 200 are partially or fully conductive, and the arrangement is termed the transistor-on mode. Moreover, charge carriers (here holes) are injected into the upper base 114. The combination of the additional holes in the drift region increases the conductivity of the drift region which lowers the forward voltage drop across the B-TRAN device. In one example, with an applied voltage of about 0.7V to about 1.0V, inclusive, across the upper collector-emitter 112 and upper base 114 (e.g., by source of charge carriers 220) the forward voltage drop may be reduced to between about 0.1V and 0.2V, inclusive.

Figure 3D:
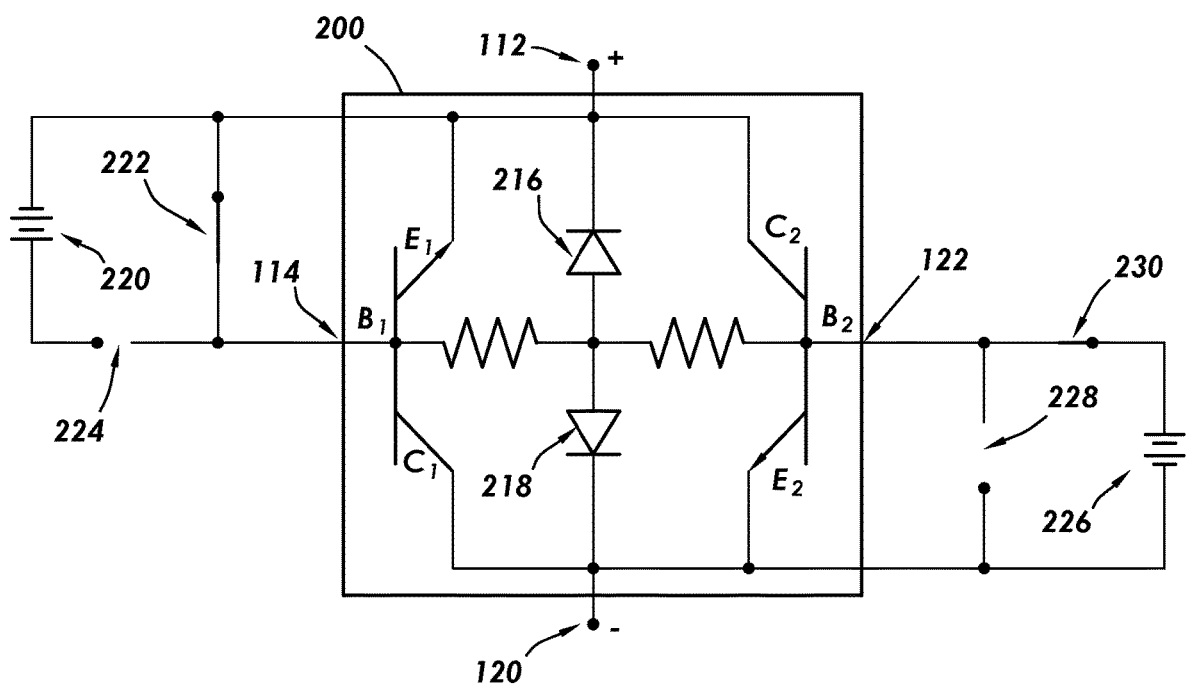
FIG. 3D shows the example model and driver circuit arranged for an conduction mode, in accordance with at least some embodiments.

FIG. 3D shows the example model and driver portions also arranged for conduction. In particular, in addition to or in place of the transistor-on mode of FIG. 3C, example embodiments may further implement a transistor-on mode as shown in FIG. 3D. That is, in order to further lower the forward voltage drop across the B-TRAN, switch 222 is made non-conductive, switch 224 is made conductive, switch 230 is made conductive, and switch 228 remains non-conductive. The transistor-on mode shown in FIG. 3D may be entered directly from the off mode, may be entered after the optional diode-on mode, or may be entered after a period of time in the transistor-on mode shown in FIG. 3C. Regardless of the entry method, in the configuration shown the source of charge carriers 220 is coupled between the upper collector-emitter 112 and the upper base 114, and the source of charge carriers 226 is coupled between the lower collector-emitter 120 and the lower base 122. The result is that the voltage on the upper base 114 (here a c-base) is driven higher than the voltage on the upper collector-emitter 112, and the voltage on the lower base 122 (here an e-base) is driven higher than the voltage on the lower collector-emitter 120. Thus, both of the example transistors of the model 200 are partially or fully conductive. Moreover, charge carriers (here holes) are injected into the upper base 114 and injected into the lower base 122. The combination of the additional holes in the drift region increases the conductivity of the drift region which may further lower the forward voltage drop across the B-TRAN device. The discussion now turns to making the B-TRAN non-conductive.

Figure 3E:
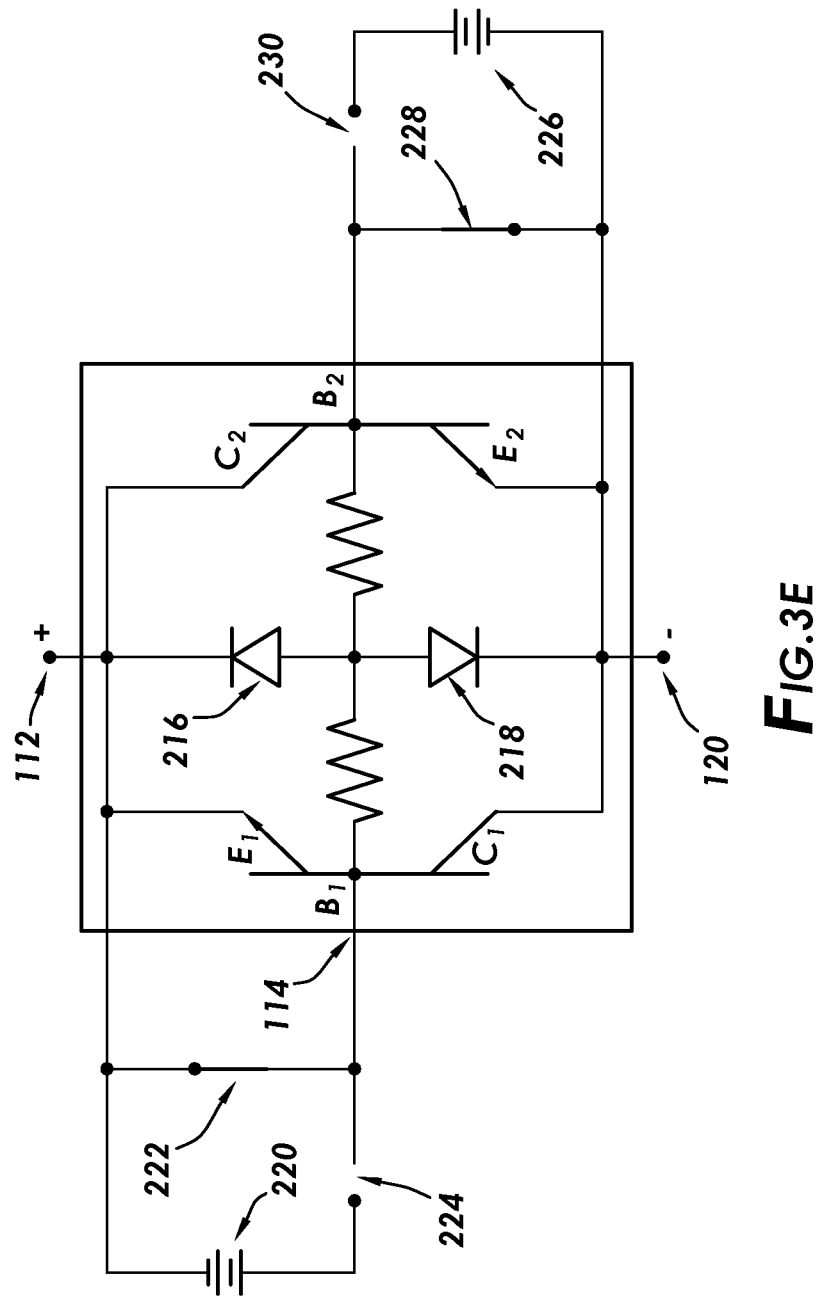
FIG. 3E shows the example model and driver circuit arranged for pre-turn off, in accordance with at least some embodiments.

FIG. 3E shows the example model and driver portions arranged for an optional pre-turn-off mode. In particular, in some examples beginning the process of making the B-TRAN non-conductive (e.g., about 0.1 µs to 5 µs before full turn-off for a 1200V device), the switches 222 and 228 are made conductive, switch 224 is made non-conductive, and if previously conductive switch 230 is made non-conductive. Making switch 224 non-conductive and making switch 222 conductive stops the injection of charge carriers into the drift region from the source of charge carriers 220. Similarly, if switch 230 was conductive during the transistor-on mode, making switch 230 non-conductive and making switch 228 conductive stops the injection of charge carriers into the drift region from the source of charge carriers 226. Moreover, making switch 228 conductive causes a large current drain or flow out of the drift region. It follows these actions remove charge carriers from the drift region, take the B-TRAN out of saturation, and increase forward voltage drop. Thus, the configuration is referred as the pre-turn-off mode. In one example, in the pre-turn-off mode the forward voltage drop may rise to between about 0.9V and 3V, inclusive. The example B-TRAN shown in FIGS. 3A-3E may then be made fully non-conductive, for the example polarity of the external voltage, by re-implementing the arrangement of FIG. 3A. In yet still other cases, particularly when the B-TRAN conduction is ended abruptly (e.g., circuit-breaker service), the pre-turn-off mode may be omitted, and the driver circuit portions may transition the B-TRAN directly from the transistor-on mode (FIG. 3C or 3D) to the off mode (FIG. 3A).

The examples with respect to FIGS. 3A-3E are for the situation of the external voltage having the more positive polarity applied at to the upper collector-emitter 112. However, the example B-TRAN is a symmetrical device, and now understanding how to control current flow through the B-TRAN in the example polarity, control of current flow in the opposite direction directly follows.

Figure 4:
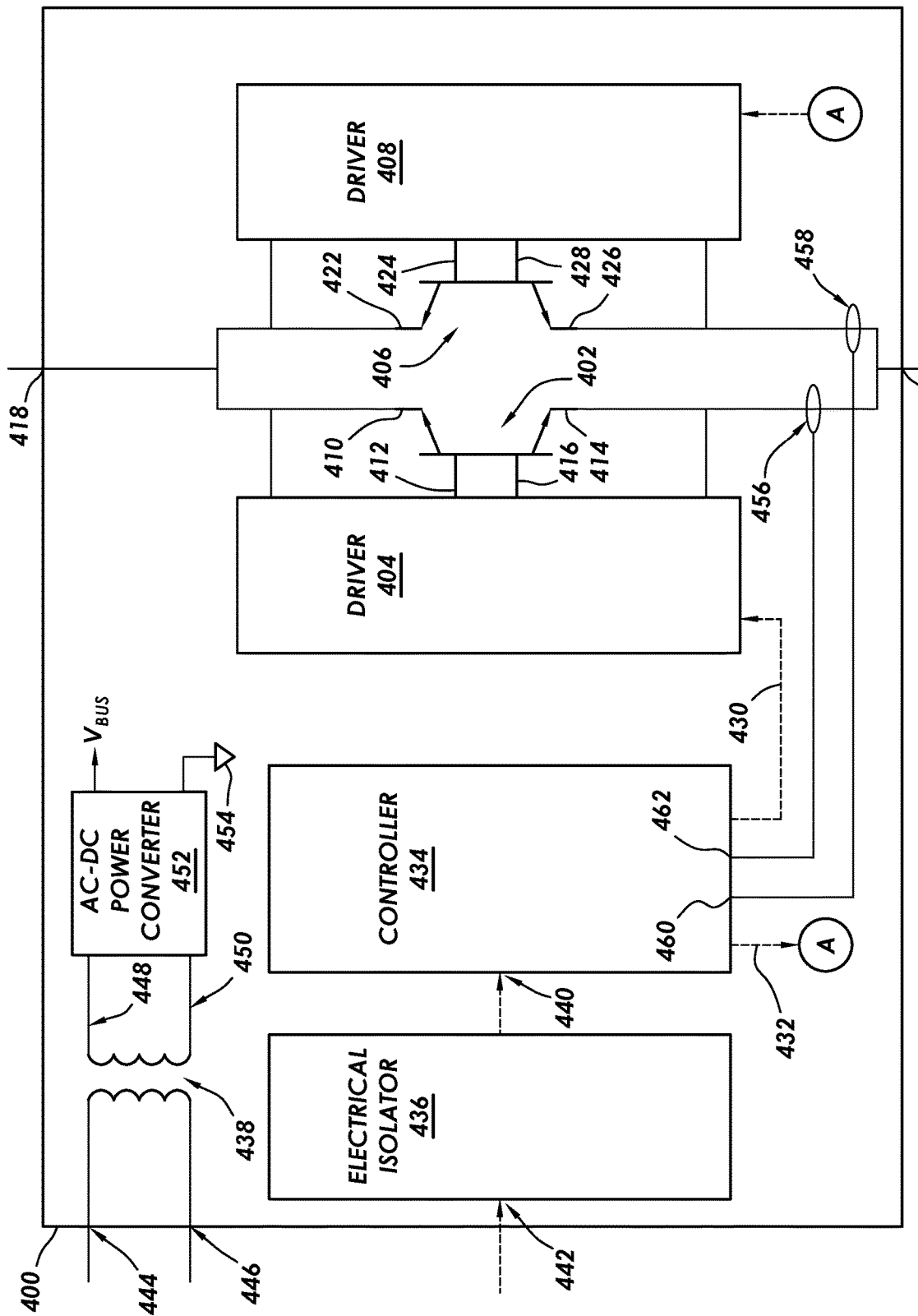
FIG. 4 shows a partial block diagram, partial electrical schematic, of a switch assembly in accordance with at least some embodiments.

FIG. 4 shows a partial block diagram, partial electrical schematic, of a switch assembly in accordance with at least some embodiments. In particular, the example switch assembly 400 comprises a first B-TRAN 402, a driver 404 associated with the first B-TRAN 402, a second B-TRAN 406, and a driver 408 associated with the second B-TRAN 406. The B-TRAN 402, in an NPN configuration, is shown by way of an example transistor circuit symbol having two emitters and two bases. The transistor circuit symbol shows an upper collector-emitter 410, an upper base 412, a lower collector-emitter 414, and a lower base 416. The upper collector-emitter 410 is coupled to an upper conduction terminal 418 of the switch assembly 400. The lower collector-emitter 414 is coupled to a lower conduction terminal 420 of the switch assembly 400. The second B-TRAN 406, in an NPN configuration, is also shown by way of the example transistor circuit symbol and comprises an upper collector-emitter 422, an upper base 424, a lower collector-emitter 426, and a lower base 428. The upper collector-emitter 422 is coupled to the upper conduction terminal 418 and the lower collector-emitter 426 is coupled to the lower conduction terminal 420, and it follows the upper collector-emitter 410 is coupled to the upper collector-emitter 422 and the lower collector-emitter 414 is coupled to the lower collector-emitter 426. The B-TRAN 406 is coupled in parallel with the first B-TRAN 402 such that the total current flow through the switch assembly 400 is shared between the B-TRAN 402 and the B-TRAN 406. While the example switch assembly 400 shows two B-TRANs, a switch assembly may have two or more B-TRANs coupled in parallel based on the total current that may flow through the switch assembly.

The example driver 404 is designed and constructed to place the B-TRAN 402 in any of the example configurations discussed with respect to FIGS. 3A-3E above, and further examples are provided below. Thus, the driver 404 couples to the B-TRAN 402, and specifically couples to the upper collector-emitter 410, the upper base 412, the lower collector-emitter 414, and the lower base 416. The driver 404 further comprises one or more command inputs that couple to and receives commands from a controller 434, the coupling shown by dashed line 430. The type and nature of the command inputs depend on the design of the driver 404, but likely contain Boolean signals coupled to control inputs of electrically-controlled switches, and in some cases analog and/or digital signals used to control the setpoint of voltage sources and/or current sources.

Similarly, the example driver 408 is designed and constructed to place the B-TRAN 406 in any of the example configurations discussed with respect to FIGS. 3A-3E above, and further examples are provided below. Thus, the driver 408 couples to the B-TRAN 406, and specifically couples to the upper collector-emitter 422, the upper base 424, the lower collector-emitter 426, and the lower base 428. The driver 408 further comprises one or more command inputs that couple to and receive commands from the controller 434, the coupling shown by dashed line 432 (and the bubble "A" connections). The type and nature of the command inputs depend on the design of the driver 408, but likely contain Boolean signals coupled to control inputs of electrically-controlled switches, and in some cases analog and/or digital signals used to control the setpoint inputs of voltage sources and/or current sources. In many cases, the drivers 404 and 408 may be of similar design and construction.

The example switch assembly 400 further comprises the controller 434, an electrical isolator 436, and an isolation transformer 438. Considering first the controller 434, transitioning the B-TRANs 402 and 406 from non-conductive states, into conductive states, and then back to non-conductive states may be a multi-state or multistep process. In some example cases the controller 434 may be individual circuit components, an application specific integrated circuit (ASIC), a microcontroller with controlling software, a reduced-instruction-set computing (RISC), a digital signal processor (DSP), process with controlling software, a processor with controlling software, a programmable logic device (PLD), a field programmable gate array (FPGA), or a combination of some or all these devices, configured to receive input signals and drive Boolean and/or analog control outputs to implement the state or mode transitions of the B-TRANs 402 and 406. The example controller 434 defines a control input 440 over which the controller 434 receives a control signal. For example, when the control input 440 is asserted by a control signal, the controller 434 may control the various signals represented by dashed line 430 to control the configuration of the driver 404 to place the B-TRAN 402 in a conductive state. Similarly, when the control input 440 is asserted by the control signal, the controller 434 may control the various signals represented by dashed line 432 to control the configuration of the driver 408 to place the B-TRAN 406 in a conductive state. Oppositely, when the control input 440 is de-asserted by the control signal, the controller 434 may control the various signals represented by dashed line 430 to control the configuration of the driver 404 to place the B-TRAN 402 in a non-conductive state, and may control the various signals represented by dashed line 432 to control the configuration of the driver 408 to place the B-TRAN 406 in a non-conductive state.

In example systems, the switch assembly 400 is electrically floated. In order to receive the control signal on the control input 440 in the electrical domain of the switch assembly 400, the example switch assembly 400 implements the electrical isolator 436. The electrical isolator 436 may take any suitable form, such as an optocoupler or a capacitive isolation device. Regardless of the precise nature of the electrical isolator 436, an external control signal (e.g., Boolean signal that, when asserted, indicates the B-TRANs should be placed in the conductive state) may be coupled to a control input 442 of the electrical isolator 436. The electrical isolator 436, in turn, passes the control signal through to the electrical domain of the switch assembly 400. In the example, the external control signal is passed through to become the control input 440 of the controller 434.

Turning now to the isolation transformer 438. Various devices within the switch assembly 400 may use operational power. For example, the controller 434 may use a bus voltage and power to enable implementation of the various modes of operation of the B-TRANs. Further, sources of charge carriers (discussed more below) within drivers 404 and 408 may in practice be implemented as individual voltage sources in the form of switching power converters, or individual current sources also implemented using switching power converters. The switching power converters implementing the sources of charge carriers may use the bus voltage and power. Again, the switch assembly 400 may be electrically floated, and in order to provide operational power within the electrical domain of the switch assembly 400 the isolation transformer 438 is provided. External systems (not specifically shown) may provide an alternating current (AC) signal across the primary leads 444 and 446 of the isolation transformer 438 (e.g., 15V AC). The isolation transformer 438 creates an AC voltage on the secondary leads 448 and 450. The AC voltage on the secondary of the isolation transformer 438 may be provided to an AC-DC power converter 452, which rectifies the AC voltage and provides power by way of bus voltage VBUS (e.g., 3.3V, 5V, 12V) with respect to a common 454. The power provided by the AC-DC power converter 452 may be used by the various components of the switch assembly 400. In other cases, multiple isolation transformers may be present (e.g., one for each side of a B-TRAN, or one for each B-TRAN). Further still, a single isolation transformer with multiple secondary windings may be used.

The example switch assembly 400 may be used in implementations in which the desired current flow is greater than can be carried by a single B-TRAN, and thus a plurality of B-TRANs may be coupled in parallel to share the total current flow across the conduction terminals 418 and 420.

However, a B-TRAN may be considered negative temperature coefficient device, meaning that for a constant applied voltage across the B-TRAN, current flow through the B-TRAN is directly proportional to temperature of the B-TRAN. When a plurality of B-TRANs are coupled in parallel, slight differences in temperature as between the B-TRANs can result one B-TRAN carrying more current than its parallel brethren. More current causes higher temperature, and thus even greater current flow, with the negative feedback eventually cascading to an early failure of the higher current-carrying B-TRAN.

In order to address the temperature and current-imbalance concerns, the example switch assembly 400 is designed and constructed to measure a value indicative of conduction (e.g., temperature, current flow) of each of the example B-TRANs 402 and 406. Based on the value indicative conduction, if there is an imbalance as between the B-TRANs (e.g., difference in current greater than a predetermined threshold), the controller 434 may adjust current flow through one or both of the B-TRANs 402 and 406 to reduce the chances of damage. The adjustment may take many forms. In some cases, the B-TRAN carrying more current is made less conductive and thus current flow through the B-TRAN is decreased. In cases in which there is constant current flow through the switch assembly 400 based characteristics of the external load, the B-TRAN(s) carrying less current may be made more conductive and thus more current flows those B-TRAN(s) which decreases current flow in the at-risk B-TRAN. As yet a further example, the adjustments may comprise both making the at-risk B-TRAN less conductive and making the remaining B-TRAN(s) more conductive.

Still referring to FIG. 4, in some cases the adjustments made by the controller 434 and the example drivers 404 and 408 may be to make the current flows through the example B-TRANs 402 and 406 match (e.g., match within a predetermined threshold of values). In yet still other cases, particularly once a B-TRAN is over a threshold temperature, the adjustments made by the controller 434 and the example drivers 404 and 408 may be to make the current flow through the over-temperature and at-risk B-TRAN lower than the remaining B-TRANs.

Consider, as an example, a situation in which an applied voltage across the conduction terminals 418 and 420 has the more positive polarity on the upper conduction terminal 418. Further consider that a control signal applied to the control input 442 of the electrical isolator 436 is de-asserted, and thus the control signal applied to the control input 440 of the controller 434 is de-asserted. Based on the de-asserted state of the control input 440, the controller 434 is designed and constructed to place the B-TRANs 402 and 406 in a non-conductive state taking into account the applied polarity. Though the circuits used by the controller 434 to read the polarity of the applied voltage are not expressly shown (so as not the further complicate the figure), the controller 434 may read the applied polarity in any suitable way. Thus, in the example arrangement the controller 434 may be designed and constructed to control the various signals represented by dashed line 430 to configure the driver 404 to place the B-TRAN 402 in a non-conductive state. Similarly, in the example arrangement the controller 434 may be designed and constructed to control the various signals represented by dashed line 432 to configure the driver 408 to place the B-TRAN 406 in a non-conductive state.

Still in the example arrangement of the positive polarity at the upper conduction terminal 418, now consider that the control signal applied to the control input 442 of the electrical isolator 436 is asserted, and thus the control signal applied to the control input 440 of the controller 434 is asserted. Based on the assertion, the controller 434 may be designed and constructed to control the various signals represented by dashed line 430 to configure the driver 404 to place the B-TRAN 402 in a conductive state. For example, the controller 434 and driver 404 may place the B-TRAN 402 in the transistor-on mode in any of the example forms discussed above, either directly or through the example diode-on mode. Similarly, in the example arrangement the controller 434 may be designed and constructed to control the various signals represented by dashed line 432 to configure the driver 408 to place the B-TRAN 406 in conductive state. For example, the controller 434 and driver 408 may place the B-TRAN 406 in the transistor-on mode, either directly or through the optional diode-on mode. In the example arrangement, the switch assembly 400 conducts current through the B-TRAN 402 and through the B-TRAN 406.

In example systems, the switch assembly 400 is further designed and constructed to measure a value indicative of conduction of the example B-TRANs 402 and 406. Measuring the value indicative of conduction may take many forms. In the example switch assembly 400 of FIG. 4, the example value indicative of conduction is a measurement of a magnitude of current through each B-TRAN 402 and 406. In particular, the example switch assembly 400 of FIG. 4 further comprise a current sensor 456 associated with the B-TRAN 402, and a current sensor 458 associated with the B-TRAN 406. The current sensors 456 and 458 are illustratively shown as current transformers (e.g., a single-turn primary carrying the current of the B-TRAN, and a multiple-turn secondary), but any suitable current sensor may be used. For example, each current sensor may be a low-value precision resistor (e.g., 0.01 Ohms) coupled in series with the current flow through associated B-TRAN. Current flow through the associated B-TRAN may thus be determined by the voltage developed across the precision resistor. As yet another example, each current sensor may be a Hall-effect sensor that measures current based on the strength of the magnetic field developed by the flowing current. In yet still other cases, the current sensors need not be duplicative sensor types. For example, one sensor may be a current transformer while another sensor may be a precision resistor. Regardless of the specific type of current sensor implemented, in example systems each current sensor is communicatively coupled to the controller 434 such that the controller can read the values indicative of conduction created by the current sensors. In the example system, the controller 434 defines measurement inputs 460 and 462 coupled to the current sensors 456 and 458, respectively. The nature of the measurement inputs 460 and 462 (e.g., analog inputs, packet-based communication ports) will depend on the specific type and signal outputs of the current sensors 456 and 458.

Further in accordance with example system, the controller 434 may be designed and constructed to adjust, by way of the driver 404 and/or the driver 408, current flow through one or both of the B-TRANs 402 and 406 responsive to the values indicative conduction being different as between the example B-TRANs 402 and 406. Again as an example, if the B-TRAN 402 has a higher temperate and thus is conducting more current than B-TRAN 406, the controller 434 may command the driver 404 to reduce current flow associated with the B-TRAN 402. In the example of B-TRAN 402 initially carrying more current, in some cases the controller 434 and driver 404 may reduce current flow through the B-TRAN 402 to match the current flow through B-TRAN 406. Oppositely, if at any point the current flow through B-TRAN 406 exceeds that of current flow through B-TRAN 402, likewise the controller 434 and driver 408 may reduce current flow through the B-TRAN 406 to match the current flow through B-TRAN 402.

Figure 5:
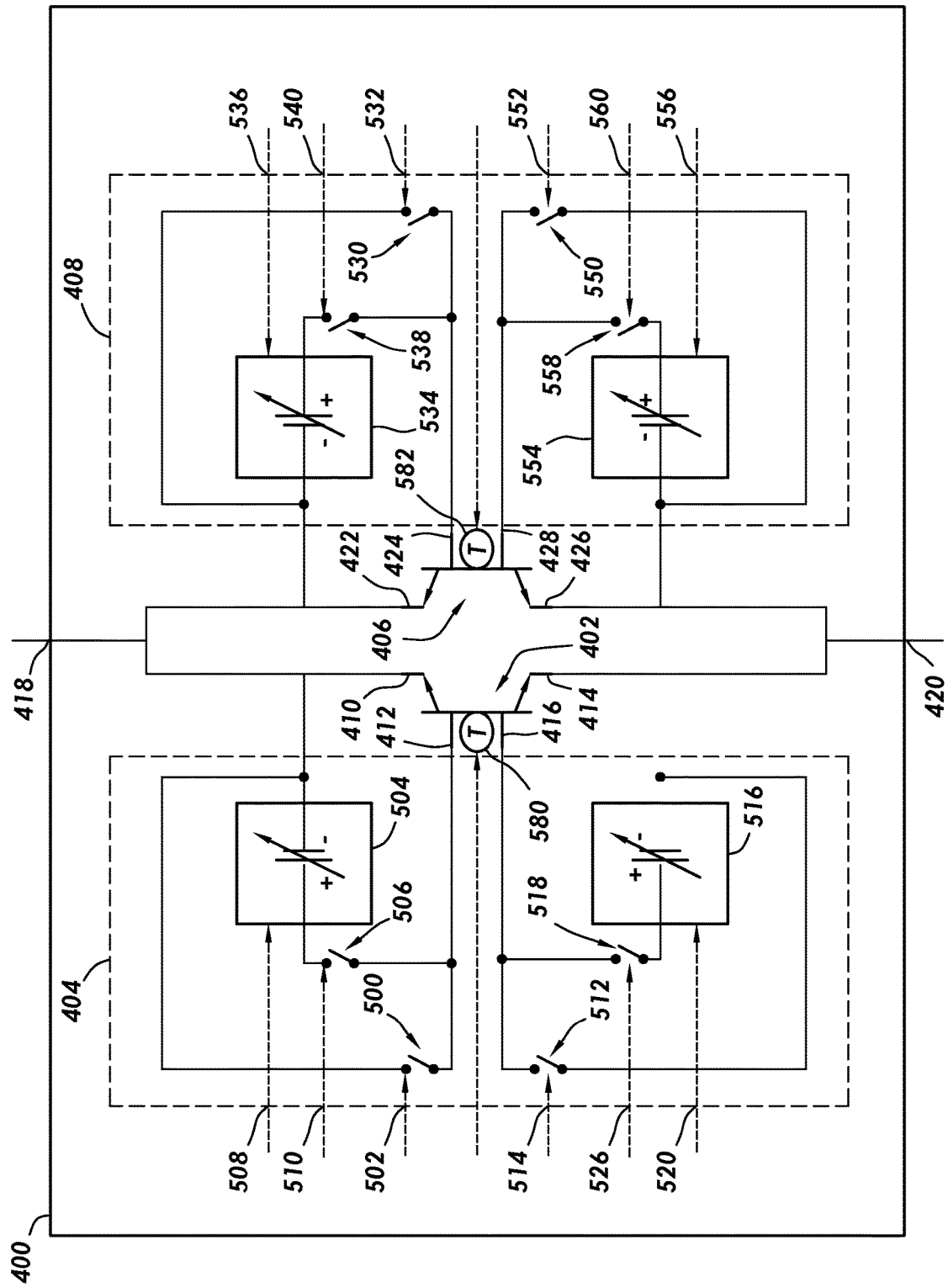
FIG. 5 shows a partial block diagram, partial electrical schematic, of a switch assembly in accordance with at least some embodiments.

FIG. 5 shows a partial block diagram, partial electrical schematic, of a switch assembly in accordance with at least some embodiments. In particular, FIG. 5 shows the B-TRAN 402, an example driver 404, the B-TRAN 406, and an example driver 408. The switch assembly 400 will likewise have the isolation transformer, the AC-DC power converter, the electrical isolator, and the controller, but those components are omitted from FIG. 5 so as not to unduly complicate the figure.

In order to place the B-TRAN 402 in the various conduction and non-conduction modes, the example driver 404 includes a plurality of electrically-controlled switches and sources of charge carriers for injection into the upper base 412 and lower base 416. In particular, the example driver 404 comprises a switch 500 that has a first lead coupled to the upper collector-emitter 410, a second lead coupled to the upper base 412, and a control input 502 coupled to the controller 434 (FIG. 4). The example switch 500 is shown as a single-pole, single-throw switch, but in practice the switch 500 may be a field effect transistor (FET) with the control input 502 being a gate of the FET. Thus, when the switch 500 is made conductive by assertion of its control input 502, the upper base 412 is coupled to the upper collector-emitter 410.

Figure 7:
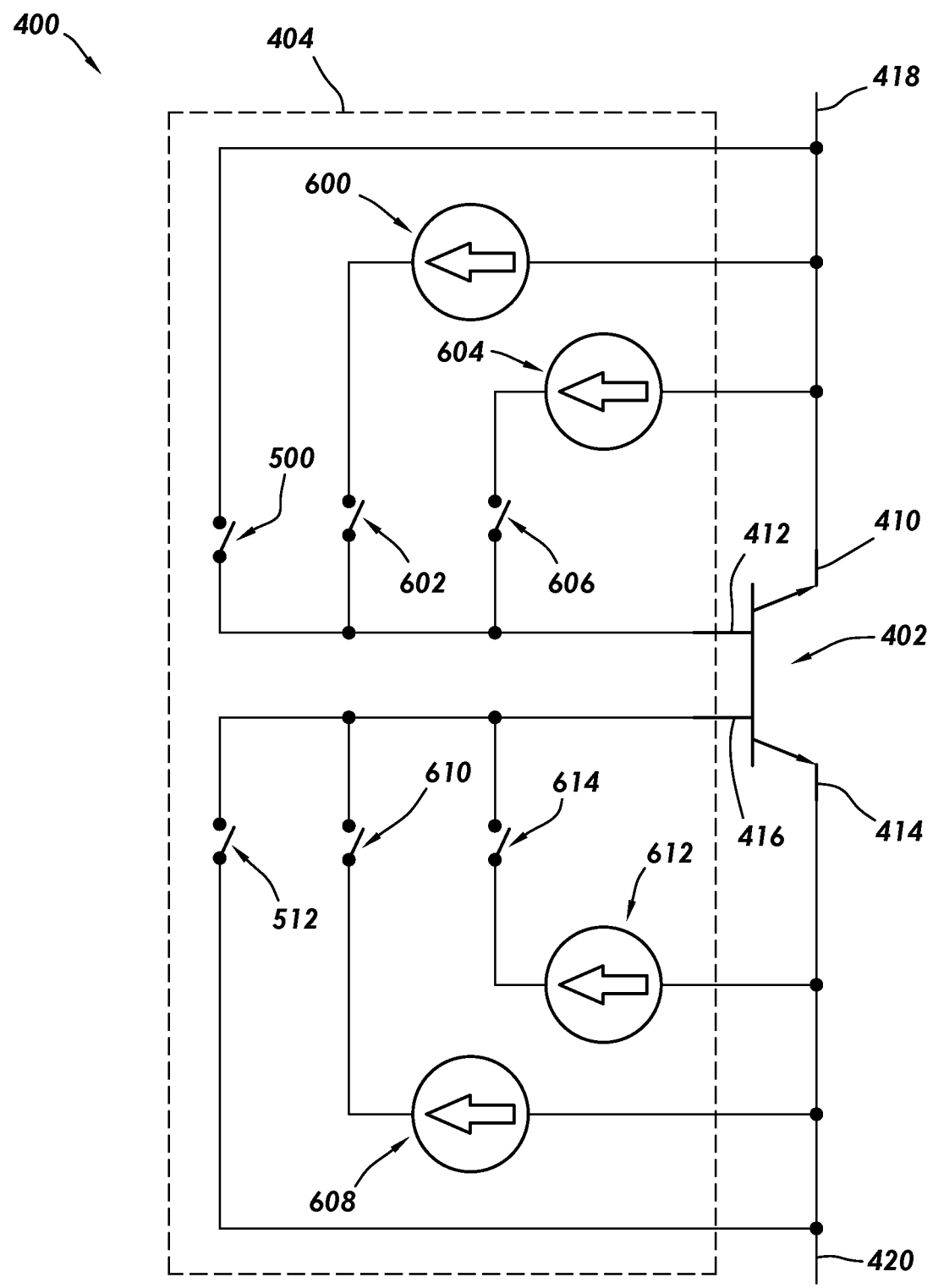
FIG. 7 shows a partial electrical schematic of a switch assembly in accordance with at least some embodiments.

The driver 404 of FIG. 7 further comprises an adjustable source of charge carriers 504, illustratively shown as an adjustable voltage source in the form of a battery, associated with the upper side of the B-TRAN 402. The source of charge carriers 504 may in practice be implemented as an individual voltage source in the form of a switching power converter having a controllable or adjustable output voltage, or an individual current source also implemented using a switching power converter with a controllable or adjustable output. The source of charge carriers 504 has a negative lead coupled to the upper collector-emitter 410, a positive lead coupled to an electrically controlled switch 506, and a setpoint input 508 coupled to the controller 434 (FIG. 4). The switch 506 has a first lead coupled to the source of charge carriers 504, a second lead coupled to the upper base 412, and a control input 510 coupled to the controller 434 (FIG. 4). The example switch 506 is shown as a single-pole, single-throw switch, but in practice the switch 506 may be a FET with the control input 510 being a gate of the FET. Thus, when switch 506 is conductive, the source of charge carriers 504 is coupled between the upper collector-emitter 410 and the upper base 412. The controller 434 defines a setpoint output (e.g., an analog output, or a digital output) coupled to the setpoint input 508, and thus the controller 434 is designed and constructed to control the rate of charge carriers produced by the source of charge carriers 504.

Turning now to the lower side of B-TRAN 402, the example driver 404 further comprises a switch 512 that has a first lead coupled to the lower collector-emitter 414, a second lead coupled to the lower base 416, and a control input 514 coupled to the controller 434 (FIG. 4). The example switch 512 is shown as a single-pole, single-throw switch, but in practice the switch 512 may be a FET with the control input 514 being a gate of the FET. Thus, when switch 512 is made conductive by assertion of its control input 514, the lower base 416 is coupled to the lower collector-emitter 414.

The driver 404 of FIG. 5 further comprises another adjustable source of charge carriers 516, illustratively shown as an adjustable voltage source in the form of a battery, associated with the lower side of the B-TRAN 402. The source of charge carriers 516 may in practice be implemented as an individual voltage source in the form of a switching power converter having a controllable or adjustable output voltage, or an individual current source also implemented using a switching power converter with a controllable or adjustable output. The source of charge carriers 516 has a negative lead coupled to the lower collector-emitter 414, a positive lead coupled to an electrically controlled switch 518, and a setpoint input 520 coupled to the controller 434. The switch 518 has a first lead coupled to the source of charge carriers 516, a second lead coupled to the lower base 416, and a control input 526 coupled to the controller 434 (FIG. 4). The example switch 518 is shown as a single-pole, single-throw switch, but in practice the switch 518 may be a FET with the control input 526 being a gate of the FET. Thus, when switch 518 is conductive, the source of charge carriers 516 is coupled between the lower collector-emitter 414 and the lower base 416. The controller 434 defines a setpoint output (e.g., an analog output, or a digital output) coupled to the setpoint input 520, and thus the controller 434 is designed and constructed to control the injection rate of charge carriers produced by source of charge carriers 516.

Turning now to B-TRAN 406. The driver 408 for B-TRAN 406 likewise has a plurality switches and sources of charge carriers. In particular, with respect to the upper side of B-TRAN 406, the driver 408 comprises a switch 530 having a control input 532, an adjustable source of charge carriers 534 having a setpoint input 536, and a switch 538 having a control input 540. The precise electrical connections are duplicative of the description with respect to the upper side of B-TRAN 402, and are shown in FIG. 5, and thus will not be repeated again here so as not to unduly lengthen the specification. Similarly for the lower side of B-TRAN 406, the driver 408 comprises a switch 550 having a control input 552, an adjustable source of charge carriers 554 having a setpoint input 556, and a switch 558 having a control input 560. The precise electrical connections are duplicative of the description with respect to the lower side of B-TRAN 402, and are shown in FIG. 5, and thus will not be repeated again here so as not to unduly lengthen the specification. The controller 434 (FIG. 4) defines control outputs and couples to various control inputs 532, 540, 552, and 560, and likewise defines outputs and couples to the setpoint inputs 536 and 556.

Still referring to FIG. 5, consider a situation in which an applied voltage across the conduction terminals 418 and 420 has the more positive polarity on the upper conduction terminal 418. Further consider that the control signal applied to the control input 440 (FIG. 4) of the controller 434 (FIG. 4) is de-asserted. Based on the de-asserted state of the control input 440, the controller 434 is designed and constructed to place the B-TRANs 402 and 406 in a non-conductive state taking into account the applied polarity. Thus, in the example arrangement the controller 434 may be designed and constructed to assert the control input 514 to make switch 512 conductive, assert the control input 552 to make switch 550 conductive, and the control inputs 502, 510, 526, 532, 540, and 560 are de-asserted such that all other switches are non-conductive, which electrically floats the upper bases 412 and 424 (similar to the arrangement of FIG. 3A for each B-TRAN).

Still in the example arrangement of the more positive polarity at the upper conduction terminal 418, now consider that the control signal applied to the control input 440 (FIG. 4) of the controller 434 (FIG. 4) is asserted. Based on the assertion, the controller 434 may be designed and constructed to place the B-TRANs 402 and 406 into the optional diode-on mode. With respect to B-TRAN 402, the optional diode-on mode may be achieved by de-asserting the control input 514 (thus making switch 512 non-conductive) and asserting control input 502 (thus making the switch 500 conductive). Making the switch 500 conductive couples the upper collector-emitter 410 to the upper base 412. The arrangement results in a current flow through the B-TRAN 402 and forward voltage drop commensurate the diode-on mode (similar to FIG. 3B). Similarly with respect to B-TRAN 406, the optional diode-on mode may be achieved by de-asserting the control input 552 (thus making switch 550 non-conductive) and asserting control input 532 (thus making the switch 530 conductive). Making the switch 530 conductive couples the upper collector-emitter 422 to the upper base 424. The arrangement results in a current flow through the B-TRAN 406 and forward voltage drop commensurate the diode-on mode (again, similar to FIG. 3B). When used, the diode-on mode may last a predetermined period (e.g., from about 0.1 μs to 5 μs).

From the diode-on mode, the controller 434 (FIG. 4) may be designed and constructed to then place the B-TRANs 402 and 406 into the transistor-on mode by injecting charge carriers into their respective upper bases. Considering first the B-TRAN 402, in the transition from the diode-on mode the controller 434 may be designed and constructed to de-assert the control input 502 (making the switch 500 non-conductive) and assert the control input 510 (making switch 506 conductive). When transitioning directly from the off mode to the transistor-on mode (and thus skipping the diode-on mode), the controller 434 may be designed and constructed to de-assert the control input 514 (thus making switch 512 non-conductive) and assert the control input 510 (making switch 506 conductive). Regardless, making the switch 506 conductive couples the source of charge carriers 504 between the upper collector-emitter 410 and the upper base 412 (similar to FIG. 3C), with the rate of charge carrier injection controlled the setpoint input 508. In some example systems, the source of charge carriers 504 creates a controlled voltage applied across the upper collector-emitter 410 and the upper base 412 of about 1.0V, which results in current flow into the upper base 412. The current flow into the upper base 412 increases the number of charge carriers in the drift region of the B-TRAN 402, which drives the B-TRAN 402 into a conductive state.

Now considering the B-TRAN 406, in the transition from the diode-on mode the controller 434 (FIG. 4) may be designed and constructed to de-assert the control input 532 (making the switch 530 non-conductive) and assert the control input 540 (making switch 538 conductive). When transitioning directly from the off mode to the transistor-on mode (and thus skipping the diode-on mode), the controller 434 may be designed and constructed to de-assert the control input 552 (thus making switch 550 non-conductive) and assert the control input 540 (making switch 538 conductive). Regardless, making switch 538 conductive couples the source of charge carriers 534 between the upper collector-emitter 422 and the upper base 424 (similar to FIG. 3C), with the rate of charge carrier injection controlled the setpoint input 536. In some example systems, the source of charge carriers 534 creates a controlled voltage applied across the upper collector-emitter 422 and the upper base 424 of about 1.0V, which results in current flow into the upper base 424. The current flow into the upper base 424 increases the number of charge carriers in the drift region of the B-TRAN 406, which drives the B-TRAN 406 into a conductive state.

Depending on the use case for switch assembly 400, conduction of current from the upper conduction terminal 418 to the lower conductional terminal 420 (and vice versa) may be for an extended period of time, approaching hours or days in some situations (e.g., the switch assembly 400 used in circuit breaker service). In other cases, the conduction of current from the upper conduction terminal 418 to the lower conductional terminal 420 (and vice versa) may be for a relatively short period of time, such as about $\frac{1}{60}^{th}$ of a second for AC-DC conversion circuits. Regardless, current flow through the B-TRANs 402 and 406 causes the B-TRANs 402 and 406 to generate heat. That is, while the forward voltage drop across the B-TRANs 402 and 406 may be driven very low (e.g., 0.2V) by the drivers 404 and 408, respectively, voltage drop and current flow generates heat within the B-TRANs 402 and 406. As discussed above, however, if one B-TRAN is hotter than the other B-TRAN, for equivalent charge carrier injection the hotter B-TRAN will carry more current, and thus produce more heat. If no action is taken, the negative feedback cascades, increasing the likelihood of damage and/or failure of the higher-temperature B-TRAN. Stated in terms of current, if one B-TRAN is carrying more current than the other B-TRAN, the B-TRAN carrying more current will produce more heat. If no action is taken, the negative feedback cascades, increasing the likelihood of damage and/or failure of the higher-current B-TRAN.

In order to address the issue, in example embodiments the controller 434 (FIG. 4) is designed and constructed to measure a value indicative of conduction of each of the B-TRANs in the switch assembly 400. The value indicative of conduction may take any suitable form. In FIG. 4, the example value indicative of conduction is current flow through each B-TRAN as measured by the current sensors 456 and 458. In FIG. 5, however, the example value indicative of conduction is temperature of each of the B-TRANs 402 and 406. In particular, the example switch assembly 400 of FIG. 5 has a temperature sensor 580 associated with the B-TRAN 402, and a temperature sensor 582 associated with the B-TRAN 406. The example temperature sensors 580 and 582 are each communicatively coupled to the controller 434 (FIG. 4).

Referring initially to temperature sensor 580, the temperature sensor 580 is mechanically and thermally coupled to the B-TRAN 402 in such a way that the temperature of the substrate of the B-TRAN 402 may directly or indirectly measured. In some cases, the temperature sensor 580 associated with the B-TRAN 402 is mechanically and thermally coupled to a heat sink that is mechanically and thermally coupled to the B-TRAN 402. In yet still other cases, the temperature sensor 580 associated with the B-TRAN 402 may be mechanically and thermally coupled directly to the substrate of the B-TRAN 402. In yet still other cases, the temperature sensor 580 may be coupled to the B-TRAN 402 as part of the construction of the switch assembly 400. In other cases, however, the temperature sensor 580 may be installed within the switch assembly 400 in such a way that electrically and mechanically coupling the B-TRAN 402 within the switch assembly 400 also mechanically and thermally couples the temperature sensor 580 to the B-TRAN 402. For example, a heat sink of a B-TRAN in a TO220 case may mechanically and thermally couple to the temperature sensor 580 when the TO220 case is mechanically coupled to an underlying circuit board.

Now referring to temperature sensor 582, the temperature sensor 582 is mechanically and thermally coupled to the B-TRAN 406 in such a way that the temperature of the substrate of the B-TRAN 406 may directly or indirectly measured. In some cases, the temperature sensor 582 associated with the B-TRAN 406 is mechanically and thermally coupled to a heat sink that is mechanically and thermally coupled to the B-TRAN 406. In yet still other cases, the temperature sensor 582 associated with the B-TRAN 406 may be mechanically and thermally coupled directly to the substrate of the B-TRAN 406. In yet still other cases, the temperature sensor 582 may be coupled to the B-TRAN 406 as part of the construction of the switch assembly 400. In other cases, however, the temperature sensor 582 may be installed within the switch assembly 400 in such a way that electrically and mechanically coupling the B-TRAN 406 within the switch assembly 400 also mechanically and thermally couples the temperature sensor 582 to the B-TRAN 406. For example, the heat sink of a B-TRAN in a TO220 case may mechanically and thermally couple to the temperature sensor 580 when the TO220 case is mechanically coupled to an underlying circuit board.

The temperature sensors 580 and 582 may take any suitable form. For example, the temperature sensors 580 and 582 may be thermocouples. In other cases, the temperature sensors 580 and 582 may be resistive thermal devices (RTDs). In many cases, the type of temperature sensors used may be the same for all the B-TRANs of a switch assembly, but in other cases varying types of temperature sensors may be used within a single switch assembly.

Still referring to FIG. 5, consider that the controller 434 (FIG. 4) commands the drivers 404 and 408 to place the B-TRANs 402 and 406 in the transistor-on mode. Further consider that in the transistor-on mode the source of charge carriers 504 associated with the B-TRAN 402 is injecting charge carriers at a first rate, and the source of charge carriers 534 associated with the B-TRAN 406 is likewise injecting charge carriers at the first rate. Further consider that, after a period time, the B-TRAN 402 is carrying greater current flow than B-TRAN 406, and thus B-TRAN 402 is hotter than B-TRAN 406. In accordance with example embodiments, the controller 434 reads a value indicative of conduction of the B-TRAN 402, and likewise reads a value indicative of conduction of the B-TRAN 406. In the example of FIG. 5, the value indicative of conduction is temperature of the B-TRANs 402 and 406, but current flow (as shown in FIG. 4) may be alternatively or additionally used. Based on the values indicative of conduction, and assuming the values indicative of conduction are different by at least a predetermined threshold, in example systems the controller 434 adjusts current flow through the B-TRAN 402.

In example embodiments, the controller 434 (FIG. 4) is designed and constructed to adjust current flow by adjusting the rate of charge carrier injection for the B-TRAN experiencing higher current flow and/or having higher temperature. Still considering the example situation of B-TRAN 402 being hotter and thus may carry greater current flow, in the example system the controller 434 decreases the current flow through the B-TRAN 402 by decreasing the rate the charge carrier injection into the upper base 412. For example, if the source of charge carriers 504 was creating a voltage of about 1.0V between the upper collector-emitter 410 and the upper base 412, in one example case the controller 434 may command the source of charge carriers 504 to create a lower voltage (e.g., about 0.5V) between the upper collector-emitter 410 and the upper base 412. The lower rate of charge carrier injection lowers the saturation level and/or increases resistance level of the B-TRAN 402, and thus the current flow through the B-TRAN 402 likewise decreases. With lower current flow comes less heat generation, and thus the temperature of the B-TRAN 402 decreases. In situations such as FIG. 4, the controller 434 may control the rate of charge carrier injection to make the temperature readings match. In cases where the value indicative of conduction is a current measurement (e.g., FIG. 4), the controller 434 may control the rate of charge carrier injection to make the currents match as between the B-TRANs.

In many cases during the transistor-on mode, the drivers 404 and 408 drive the B-TRANs 402 and 406, respectively, to a fully saturated state, thus providing the highest current flow for the applied voltage across the conduction terminals 418 and 420. However, in other cases the drivers 404 and 408 may drive the B-TRANs 402 and 406, respectively, to a state that is less than fully saturated. Stated otherwise, the rate of charge carrier injection into each upper base may be less than a charge carrier injection that would drive the B-TRAN to a fully saturated state. For example, the switch assembly 400 may be used as part of a constant current source, the switch assembly may implement a current limiting feature, or the load connected electrically downstream of the switch assembly 400 may draw a constant current. Regardless of the precise reason for operating the switch assembly 400 with the B-TRANs at less than fully saturated during the transistor-on mode, the example operational state provides an alternative method of reducing the current flow through a B-TRAN that is carrying greater current and/or has a higher temperature.

Still referring to FIG. 5, consider again that voltage applied across the conduction terminals 418 and 420 has the more positive polarity on the upper conduction terminal 418. Further consider that the controller 434 (FIG. 4) has commanded the drivers 404 and 408 to place the B-TRANs 402 and 406, respectively, into the transistor-on mode, but at less than full saturation. Finally, consider that the B-TRAN 402 is hotter and thus may carry greater current flow. The controller 434 may again measure values indicative of conduction in any of the example forms discussed above. In this example, the values indicative of conduction indicate the B-TRAN 402 is carrying more current and/or has a higher temperature. In this example, the controller 434 may be designed and constructed to adjust the current flow by increasing the current flow through the B-TRAN 406 that is carrying less current and/or has a lower temperature. Because of the example constant current situation, increasing the current flow through the B-TRAN 406 carrying less current and/or having a lower temperature will have the effect of lowering current flow through the B-TRAN 402. Thus, for example, the controller 434 may command the source of charge carriers 534 associated with the B-TRAN 406 to increase the rate of charge carrier injection (e.g., increase the applied voltage, increase applied current). Depending on the disparity between the B-TRANs, the controller 434 may also command the source of charge carriers 504 associated with the B-TRAN 402 to decrease the rate of charge carrier injection (e.g., decrease the applied voltage, decrease applied current). The net result, however, is that current flow through the B-TRANs changes to address the current and/or temperature imbalance.

In yet still other cases the adjustments made responsive to one B-TRAN carrying more current and/or having a higher temperature may be based on control of switches on the negative-polarity side of the device. Still with reference to FIG. 5, consider again that voltage applied across the conduction terminals 418 and 420 has the more positive polarity on the upper conduction terminal 418. Further consider that the controller 434 (FIG. 4) has commanded the drivers 404 and 408 to place the B-TRANs 402 and 406, respectively, into the transistor-on mode, and that the B-TRAN 402 is hotter and thus carrying greater current flow. The controller 434 may again measure values indicative of conduction in any of the example forms discussed above. In this example, the values indicative of conduction indicate the B-TRAN 402 is carrying more current and/or has a higher temperature. As before, the controller 434 may be designed and constructed to adjust the current flow by decreasing the current flow through the B-TRAN 402. In this example, decreasing the current flow through the B-TRAN 402 may involve the controller 434 commanding switch 512 to become momentarily conductive during the transistor-on mode. The momentary conductive state of the switch 512 drains charge carriers from the drift region of the B-TRAN 402, which makes B-TRAN 402 less conductive, and which lowers the total current carried by B-TRAN 402. In some cases, a single conduction period may be sufficient. In other cases, the controller 434 may pulse the switch 512 at a particular frequency and duty cycle. For example, the controller 434 may make the switch conductive at a particular frequency, and the controller 434 may control or adjust the duty cycle of each pulse to the control the value indicative of conduction. In yet still other cases, the controller 434 may use a constant duty cycle and vary frequency at which the switch 512 is made conductive. Further still, the controller 434 vary the frequency and the duty cycle in an attempt to bring the values indicative of conduction back into alignment.

In yet still other cases, the adjustments made responsive to one B-TRAN carrying more current and/or having a higher temperature may be based on control of the source of charge carriers on the negative-polarity side of the device. Still referring to FIG. 5, consider that the controller 434 (FIG. 4) commands the drivers 404 and 408 to place the B-TRANs 402 and 406 in the transistor-on mode in which the sources of charge carriers associated with both faces of the device are active (e.g., FIG. 3D). In such a situation, for B-TRAN 402 both the source of charge carriers 504 and the source of charge carriers 516 are active an injecting charge carriers into their respective bases, and for B-TRAN 406 both the source of charge carriers 534 and the source of charge carriers 554 are active an injecting charge carriers into their respective bases. Further consider that the B-TRAN 402 is carrying greater current flow than B-TRAN 406, and thus B-TRAN 402 is hotter than B-TRAN 406. The controller 434 may again measure values indicative of conduction in any of the example forms discussed above. In this example, the values indicative of conduction indicate the B-TRAN 402 is carrying more current and/or has a higher temperature. As before, the controller 434 may be designed and constructed to adjust the current flow by decreasing the current flow through the B-TRAN 402. Here, however, the controller 434 may decrease the current flow through the B-TRAN 402 by decreasing the rate the charge carrier injection into the lower base 416 while leaving the charge carrier injection into the upper base 412 unchanged. For example, if the source of charge carriers 516 was creating a voltage of about 1.0V between the lower collector-emitter 414 and the lower base 416, in one example case the controller 434 may command the source of charge carriers 516 to create a lower voltage (e.g., about 0.5V)

between the lower collector-emitter 414 and the lower base 416 while leaving the rate of charge carrier injection into the upper base 412 unchanged. The lower rate of charge carrier injection into the lower base 416 lowers the saturation level and/or increases the resistance level of the B-TRAN 402, and thus the current flow through the B-TRAN 402 likewise decreases. With lower current flow comes less heat generation, and thus the temperature of the B-TRAN 402 decreases. In situations such as FIG. 4, the controller 434 may control the rate of charge carrier injection to make the temperature readings match. In cases where the value indicative of conduction is a current measurement (e.g., FIG. 4), the controller 434 may control the rate of charge carrier injection to make the currents match as between the B-TRANs.

The example operations discussed with respect to FIG. 5 was with respect to an assumed polarity applied by the external voltage, and in each case an assumption that the B-TRAN 402 was carrying greater current and/or had the higher temperature. However, the example B-TRANs 402 and 406 are duplicative devices, and now understanding how to adjust current flow and/or temperature with respect to the B-TRAN 402, adjustment of current flow and/or temperature of B-TRAN 406 directly follows. Further still, the example B-TRANs 402 and 406 are symmetrical devices, and now understanding how to adjust current flow and/or temperature for the applied polarity, control of current flow and/or temperature in the opposite direction directly follows.

Figure 6:
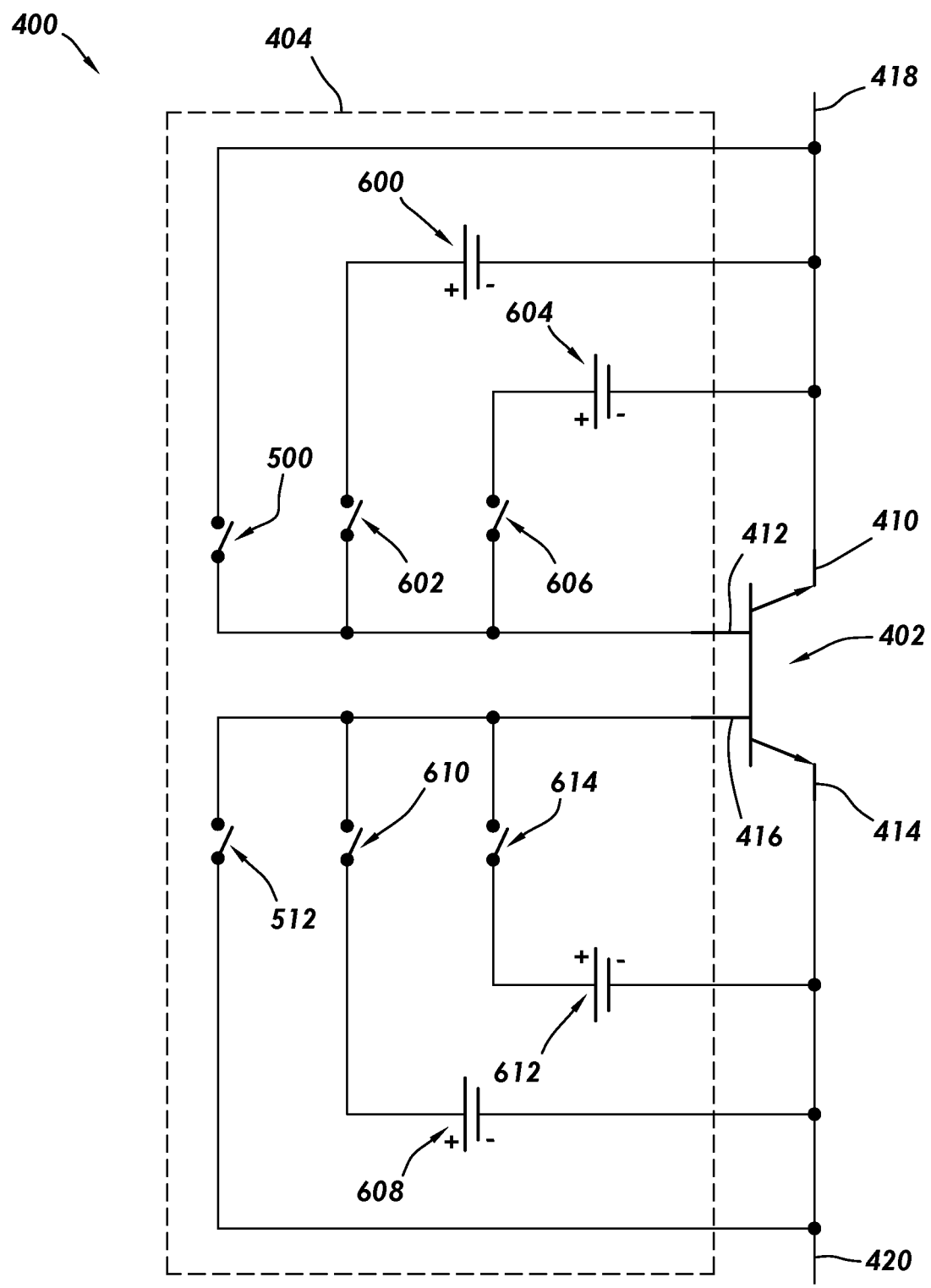
FIG. 6 shows a partial electrical schematic of a switch assembly in accordance with at least some embodiments.

FIG. 6 shows a partial electrical schematic of a switch assembly in accordance with at least some embodiments. In particular, FIG. 6 shows the example B-TRAN 402 as well as portions of an example driver 404. The switch assembly 400 will likewise have the isolation transformer, the AC-DC power converter, the electrical isolator, and the controller, but those components are omitted from the shorthand notation of FIG. 6. Moreover, the switch assembly 400 will also have additional B-TRANs (e.g., B-TRAN 406) and drivers (e.g., driver 408 for B-TRAN 406), but the additional B-TRANs and drivers are omitted so as not to further complicate the figure. For purposes of discussion, FIG. 6 shows the switches 500 and 512 as originally presented with respect to FIG. 5.

Referring initially to the upper side of the B-TRAN 402, the driver 404 of FIG. 6 further includes a source of charge carriers 600 illustratively shown as a battery. The source of charge carriers 600 has a negative lead coupled to the upper collector-emitter 410, and a positive lead coupled to an electrically-controlled switch 602 (hereafter just switch 602). The switch 602 has a first lead coupled to the positive terminal of the source of charge carriers 600, a second lead coupled to the upper base 412, and a control input (not shown) coupled to the controller 434 (FIG. 4). Thus, when the switch 602 is conductive, the source of charge carriers 600 is coupled between the upper collector-emitter 410 and the upper base 412. The driver 404 of FIG. 6 further includes another source of charge carriers 604 illustratively shown as a battery. The source of charge carriers 604 has a negative lead coupled to the upper collector-emitter 410, and a positive lead coupled to an electrically-controlled switch 606 (hereafter just switch 606). The switch 606 has a first lead coupled to the positive terminal of the source of charge carriers 604, a second lead coupled to the upper base 412, and a control input (not shown) coupled to the controller 434 (FIG. 4). Thus, when the switch 606 is conductive, the source of charge carriers 604 is coupled between the upper collector-emitter 410 and the upper base 412.

Turning now the lower side of the B-TRAN 402, the example driver 404 of FIG. 6 further includes a source of charge carriers 608 illustratively shown as a battery. The source of charge carriers 608 has a negative lead coupled to the lower collector-emitter 414, and a positive lead coupled to an electrically-controlled switch 610 (hereafter just switch 610). The switch 610 has a first lead coupled to the positive terminal of the source of charge carriers 608, a second lead coupled to the lower base 416, and a control input (not shown) coupled to the controller 434 (FIG. 4). Thus, when the switch 610 is conductive, the source of charge carriers 608 is coupled between the lower collector-emitter 414 and the lower base 416. The driver 404 of FIG. 6 further includes another source of charge carriers 612 illustratively shown as a battery. The source of charge carriers 612 has a negative lead coupled to the lower collector-emitter 414, and a positive lead coupled to an electrically-controlled switch 614 (hereafter just switch 614). The switch 614 has a first lead coupled to the positive terminal of the source of charge carriers 612, a second lead coupled to the lower base 416, and a control input (not shown) coupled to the controller 434 (FIG. 4). Thus, when the switch 614 is conductive, the source of charge carriers 612 is coupled between the lower collector-emitter 414 and the lower base 416.

Consider, as an example, a situation in which an applied voltage across the conduction terminals 418 and 420 has the more positive polarity on the upper conduction terminal 418. Further consider that the controller 434 (FIG. 4) has commanded the driver 404 to place the B-TRAN 402, and other B-TRANs in the switch assembly 400 (not specifically shown), into the transistor-on mode. Finally, consider that the B-TRAN 402 is hotter and thus may carry greater current flow. The controller 434 may measure values indicative of conduction in any of the example forms discussed above. In this example and based on the assumptions, the values indicative of conduction indicate the B-TRAN 402 is carrying more current and/or has a higher temperature. In the example system the controller 434 decreases the current flow through the B-TRAN 402 by decreasing the rate the charge carrier injection into the upper base 412. In the example case of FIG. 6, changing the rate of carrier injection may be implemented by selective use of the sources of charge carriers 600 and 604. Consider, as an example, that the source of charge carriers 600 creates an applied voltage of 1.0V, and the source of charge carriers 604 creates an applied voltage 0.5V. When in the transistor-on mode, initially the switch 602 may be conductive thus coupling the source of charge carriers 600 across the upper collector-emitter 410 and the upper base 412. However, if the B-TRAN 402 carries more current and/or has a higher temperature, the controller 434 may change the rate charge carrier injection by making switch 602 non-conductive and making switch 606 conductive, thus coupling the source of charge carriers 604 across the upper collector-emitter 410 and the upper base 412. In this example, the swap from the source of charge carriers 600 to the source of charge carriers 604 drops the applied voltage from 1.0V to 0.5V, thus reducing the rate of charge carrier injection. With lower charge carrier injection the current flow through the B-TRAN 402 will be reduced.

Similarly in situations in which the transistor-on mode involves injecting charge carriers into both the upper-base 412 and the lower base 416, reducing current flow may also comprise reducing charge carrier injection into the lower base 416 (with or without changes in charge carrier injection into the upper base 412). That is sources of charge carriers 608 and 612 may be selective utilized to control charge carrier injection, including reducing charge carrier injection, in any suitable form, to reduce current flow through the example B-TRAN 402.

The example operations discussed with respect to FIG. 6 was with respect to an assumed polarity applied by the external voltage, and an assumption that the B-TRAN 402 was carrying greater current and/or had the higher temperature. As before, however, the B-TRANs are duplicative devices, and now understanding how to adjust current flow and/or temperature with respect to the B-TRAN 402, adjustment of current flow and/or temperature of remaining B-TRAN (not specifically shown) directly follows. Further still, the example B-TRANs are symmetrical devices, and now understanding how to adjust current flow and/or temperature for the applied polarity, control of current flow and/or temperature in the opposite direction directly follows.

FIG. 7 shows a partial electrical schematic of a switch assembly in accordance with at least some embodiments. In particular, FIG. 7 shows the example B-TRAN 402 as well as portions of an example driver 404. The switch assembly 400 will likewise have the isolation transformer, the AC-DC power converter, the electrical isolator, and the controller, but those components are omitted from the shorthand notation of FIG. 7. Moreover, the switch assembly 400 will also have additional B-TRANs (e.g., B-TRAN 406) and drivers (e.g., driver 408 for B-TRAN 406), but the additional B-TRANs and drivers are omitted so as not to further complicate the figure. FIG. 7 also shows the switches 500, 602, 606, 512, 610, and 614. In FIG. 7, however, the example sources of charge carriers 600, 604, 608, and 612 are illustratively shown as current sources rather than voltage sources or batteries. Operation of the example embodiments of FIG. 7 are similar to FIG. 5 (with a single source of charge carriers on each side of the B-TRAN), or FIG. 6. When using current sources as the sources of charge carriers, rather than applying and maintaining a particular voltage between a base and collector-emitter, the source of charge carriers modulates applied voltage to provide a defined current into the respective base. For example, for the current sources that may be active during the transistor-on mode, the current setpoint may be about 20 A to 30 A (for a 100 A B-TRAN device). When current flow through a particular B-TRAN is to be reduced because of the B-TRAN carrying higher current and/or having higher temperature, current flow may be reduced (e.g., to about 10 A-20 A) to reduce the saturation state and therefore reduce the current flow through the B-TRAN device. In yet still other cases, though not specifically shown, the constant current sources may themselves be adjustable, and thus the variations with respect to sources of charge carriers in the form of voltage sources are equally applicable to the sources of charge carriers in the form of current sources.

Figure 8:
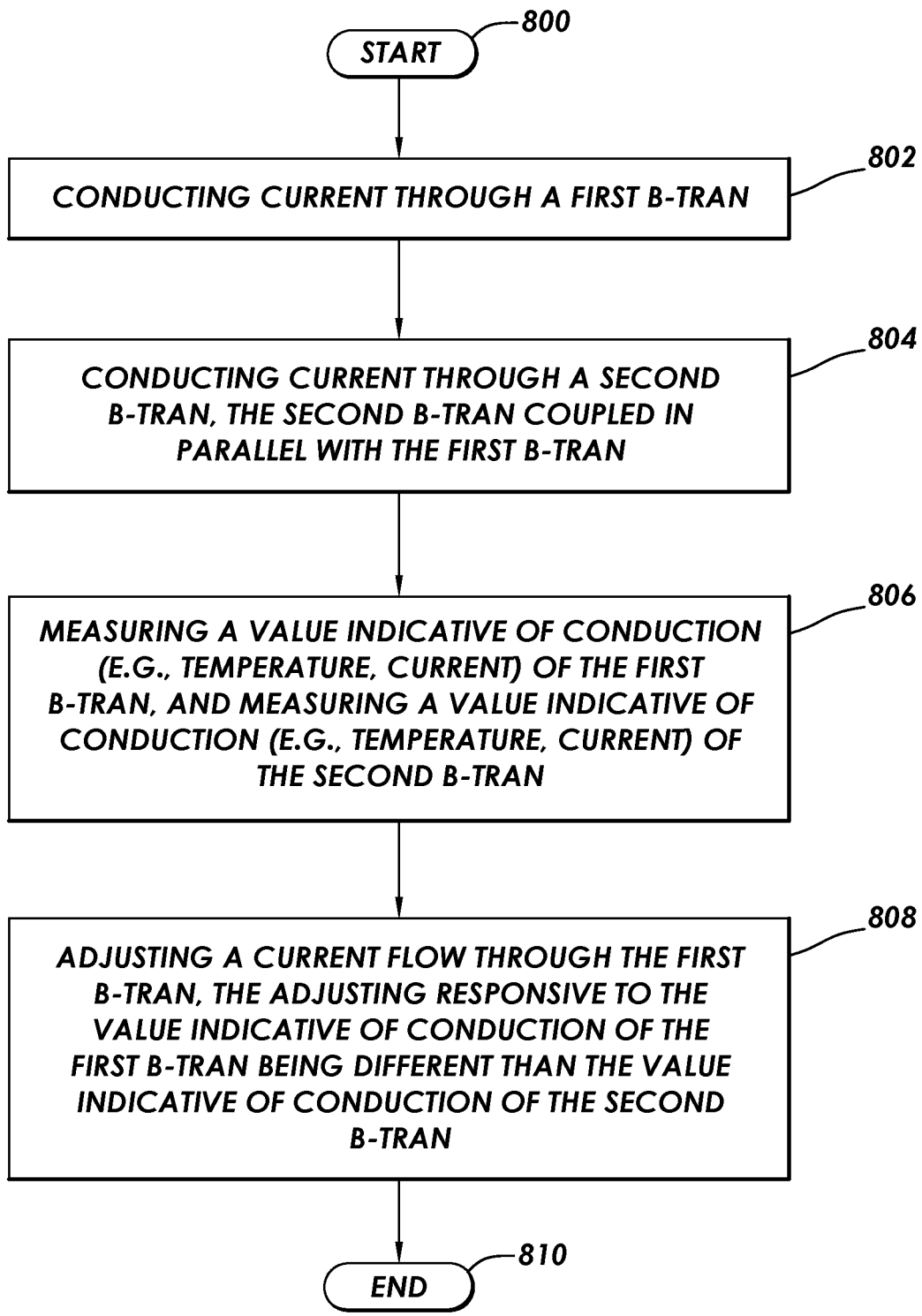
FIG. 8 shows a method in accordance with at least some embodiments.

FIG. 8 shows a method in accordance with at least some embodiments. In particular, the method starts (block 800) and comprises: conducting current through a first B-TRAN (block 802); conducting current through a second B-TRAN, the second B-TRAN coupled in parallel with the first B-TRAN (block 804); measuring a value indicative of conduction (e.g., temperature, current) of the first B-TRAN, and measuring a value indicative of conduction (e.g., temperature, current) of the second B-TRAN (block 806); and adjusting a current flow through the first B-TRAN, the adjusting responsive to the value indicative of conduction of the first B-TRAN being different than the value indicative of conduction of the second B-TRAN (block 808). Thereafter, the method ends (block 810), likely to be restarted in the next conduction period.

Many of the electrical connections in the drawings are shown as direct couplings having no intervening devices, but not expressly stated as such in the description above. Nevertheless, this paragraph shall serve as antecedent basis in the claims for referencing any electrical connection as "directly coupled" for electrical connections shown in the drawing with no intervening device(s).

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method of operating bidirectional double-base bipolar junction transistors, the method comprising:
   conducting current through a first bidirectional double-base bipolar junction transistor (first B-TRAN);
   conducting current through a second bidirectional double-base bipolar junction transistor (second B-TRAN), the second B-TRAN coupled in parallel with the first B-TRAN;
   measuring a value indicative of temperature of the first B-TRAN, and measuring a value indicative of temperature of the second B-TRAN; and
   adjusting a current flow through the first B-TRAN, the adjusting responsive to the value indicative of temperature of the first B-TRAN being different than the value indicative of temperature of the second B-TRAN.

2. The method of claim 1 wherein measuring the value indicative of temperature of the first B-TRAN further comprises measuring current flow through the first B-TRAN.

3. The method of claim 1 wherein measuring the value indicative of temperature of the first B-TRAN further comprises measuring temperature of a bulk region of the first B-TRAN.

4. The method of claim 3 wherein measuring temperature of the bulk region of the first B-TRAN further comprises as least one selected from a group comprising: measuring temperature of a heat sink thermally coupled to the B-TRAN; and measuring temperature of the substrate of the first B-TRAN.

5. The method of claim 1 wherein adjusting the current flow through the first B-TRAN further comprises decreasing current flow.

6. The method of claim 1 wherein adjusting the current flow through the first B-TRAN further comprises decreasing the current flow to match a current flow through the second B-TRAN.

7. The method of claim 1 wherein adjusting the current flow through the first B-TRAN further comprises changing a rate of charge carriers injected into a collector-side base of the first B-TRAN.

8. The method of claim 7 wherein changing a rate of charge carriers injected into the collector-side base further comprises at least on selected from a group comprising: changing a voltage coupled between a collector-emitter of the first B-TRAN and the collector-side base; and changing current flow through a current source coupled between the collector-emitter and the collector-side base.

9. The method of claim 1 wherein adjusting the current flow through the first B-TRAN further comprises changing a rate of charge carriers injected into an emitter-side base of the first B-TRAN.

10. A switch assembly comprising:
a first bidirectional double-base bipolar junction transistor (first B-TRAN) defining an upper base, an upper collector-emitter, a lower base, and a lower collector-emitter;
a second bidirectional double-base bipolar junction transistor (second B-TRAN) defining an upper base, an upper collector-emitter, a lower base, and a lower collector-emitter, the second B-TRAN coupled in parallel with the first B-TRAN;
a controller;
a first means for measuring conduction through the first B-TRAN, the first means for measuring coupled to the controller;
a first means for controlling conduction through the first B-TRAN, the first means for controlling conduction coupled to the controller;
a second means for measuring conduction through the second B-TRAN, the second means for measuring coupled to the controller;
wherein the controller is configured to:
read a value indicative of conduction through the first B-TRAN;
read a value indicative of conduction through the first B-TRAN; and
adjust, by way of the first means for controlling, current flow through the first B-TRAN, the adjustment responsive to the value indicative of conduction of the first B-TRAN being different than the value indicative of conduction through second B-TRAN.

11. The switch assembly of claim 10 further comprising:
a second means for controlling conduction through the second B-TRAN, the second means for controlling coupled to the controller;
wherein the controller is further configured to, simultaneously with the adjustment of current flow through the first B-TRAN, at least one selected from a group comprising: maintain, by way of the second means for controlling, current flow through the second B-TRAN unchanged; and increase, by way of the second means for controlling, current flow through the second B-TRAN.

12. The switch assembly of claim 10:
wherein the first means for measuring conduction further comprises a temperature sensor associated with the first B-TRAN;
wherein the second means for measuring conduction further comprises a temperature sensor associated with the second B-TRAN;
wherein when the controller adjusts current flow through the first B-TRAN, the controller is further configured to adjust responsive to a value indicative of temperature of associated with the first B-TRAN being higher than a value indicative of temperature associated with the second B-TRAN.

13. The switch assembly of claim 12 wherein the temperature sensor associated with the first B-TRAN further comprises at least one least one selected from a group comprising: the temperature sensor associated with the first B-TRAN coupled to a heat sink thermally coupled to the first B-TRAN; and the temperature sensor associated with the first B-TRAN thermally coupled to a substrate of the first B-TRAN.

14. The switch assembly of claim 12 wherein when the controller adjusts current flow through the first B-TRAN the controller is further configured to at least one selected from a group comprising: decrease the current flow through the first B-TRAN; and decrease the current flow through the first B-TRAN to match a current flow through the second B-TRAN.

15. The switch assembly of claim 10:
wherein the first means for measuring conduction further comprises a current sensor associated with the first B-TRAN;
wherein the second means for measuring conduction further comprises a current sensor associated with the second B-TRAN;
wherein when the controller adjusts current flow through the first B-TRAN, the controller is further configured to adjust responsive to a value indicative of current flow through the first B-TRAN being higher than a value indicative of current flow through the second B-TRAN.

16. The switch assembly of claim 15 wherein when the controller adjusts current flow through the first B-TRAN the controller is further configured to at least one selected from a group comprising: decrease the current flow through the first B-TRAN; and decrease the current flow through the first B-TRAN to match a current flow through the second B-TRAN.

17. The switch assembly of claim 10:
wherein the first means for controlling conduction further comprises a means for injecting charge carriers into the upper base of the first B-TRAN;
wherein when the controller adjusts current flow through the first B-TRAN, the controller is further configured to change, by way of the means for injecting charge carriers, a rate of charge carrier injection into the upper base of the first B-TRAN.

18. The switch assembly of claim 17 wherein when the controller changes the rate of charge carrier injection, the controller is further configured to reduce current flow through the first B-TRAN by reducing the rate of charge carrier injection into the upper base of the first B-TRAN.

19. The switch assembly of claim 17 wherein when the controller reduces the rate of charge carrier injection into the upper base of the first B-TRAN, the controller is further configured to at least one selected from a group comprising: decrease the current flow through the first B-TRAN; and decrease the current flow through the first B-TRAN to match a current flow through the second B-TRAN.

20. The switch assembly of claim 17 wherein the means for injecting charge carriers is at least one selected from a group comprising: a voltage source coupled between the upper collector-emitter and the upper base of the first B-TRAN; an adjustable voltage source coupled between the upper collector-emitter and the upper base of the first B-TRAN; a current source coupled between the upper collector-emitter and the upper base of the first B-TRAN; and an adjustable current source coupled between the upper collector-emitter and the upper base of the first B-TRAN.

21. The switch assembly of claim 17:
wherein the first means for controlling conduction further comprises a means for injecting charge carriers into the upper base of the first B-TRAN and a means for injecting charge carriers into the lower base of the first B-TRAN;
wherein when the controller adjusts the current flow through the first B-TRAN, the controller is further configured to:
maintain a rate of charge carrier injection into the upper base of the first B-TRAN; and simultaneously
decrease a rate of charge carrier injection in to the lower base of the first B-TRAN.

22. The switch assembly of claim 17:
wherein the first means for controlling conduction further comprises a means for injecting charge carriers into the upper base of the first B-TRAN and a means for draining charge carriers from a bulk region of the first B-TRAN;
wherein when the controller adjusts the current flow through the first B-TRAN, the controller is further configured reduce current flow through the first B-TRAN being configured to:
  maintain a rate of charge carrier injection into the upper base of the first B-TRAN; and simultaneously
  drain charge carriers from the bulk region of the first B-TRAN.

\* \* \* \* \*

UNITED STATES PATENT AND TRADEMARK OFFICE
CERTIFICATE OF CORRECTION

PATENT NO.         : 11,496,129 B2
APPLICATION NO.    : 17/340604
DATED              : November 8, 2022
INVENTOR(S)        : Alireza Mojab It is certified that error appears in the above-identified patent and that said Letters Patent is hereby corrected as shown below:

In the Claims

Claim 10, Line 24, "through the first" should be --through the second--

Claim 13, Line 58, "at least one least one selected" should be --at least one selected--

Signed and Sealed this
Third Day of January, 2023

Katherine Kelly Vidal
*Director of the United States Patent and Trademark Office*